(12) United States Patent
Choi et al.

(10) Patent No.: US 12,514,089 B2
(45) Date of Patent: Dec. 30, 2025

(54) DISPLAY DEVICE

(71) Applicant: LG Display Co., Ltd., Seoul (KR)

(72) Inventors: Mingyu Choi, Anyang-si (KR); Se-Jin Lee, Paju-si (KR); Eungi Jeon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 543 days.

(21) Appl. No.: 18/058,158

(22) Filed: Nov. 22, 2022

(65) Prior Publication Data

US 2023/0209954 A1     Jun. 29, 2023

(30) Foreign Application Priority Data

Dec. 27, 2021    (KR) ........................ 10-2021-0188394

(51) Int. Cl.
     *H10K 59/35*        (2023.01)
     *H10K 59/12*        (2023.01)

(52) U.S. Cl.
     CPC ........... *H10K 59/353* (2023.02); *H10K 59/12* (2023.02); *H10K 59/351* (2023.02)

(58) Field of Classification Search
     CPC ..... H10K 59/353; H10K 59/351; H10K 59/12
     See application file for complete search history.

(56) References Cited

U.S. PATENT DOCUMENTS

| 9,634,288 B2 | 4/2017 | Park et al. | |
| 2017/0179441 A1* | 6/2017 | Lee | H10K 59/877 |
| 2021/0242432 A1* | 8/2021 | Lee | H10K 50/858 |
| 2021/0351236 A1* | 11/2021 | Shin | H10K 59/873 |
| 2022/0052125 A1* | 2/2022 | Choi | H10K 50/844 |
| 2022/0302420 A1* | 9/2022 | Ma | H10K 50/865 |

FOREIGN PATENT DOCUMENTS

| KR | 20160019574 A | 2/2016 |
| KR | 10-2017-0074252 A | 6/2017 |
| KR | 20190027175 A | 3/2019 |
| KR | 10-2019-0051634 A | 5/2019 |
| KR | 20200071367 A | 6/2020 |

\* cited by examiner

*Primary Examiner* — Mary Ellen Bowman
(74) *Attorney, Agent, or Firm* — Seed Intellectual Property Group LLP

(57) ABSTRACT

Transmittance adjustment pattern member including a plurality of patterns is disposed on one face of a substrate and in a light-emitting area and a light-transmissive area such that a distribution density of the patterns in the light-emitting area is higher than a distribution density of the patterns in the light-transmissive area. Accordingly, while light generated in a background area passes through the transmittance adjustment pattern member, light may be first inversely-diffracted such that a wavelength thereof may be converted into an inversely-diffracted wavelet. Then, the light having the inversely-diffracted wavelet passes through the light-transmissive area, and thus the inversely-diffracted wavelet may be eventually converted into a non-diffracted wavelet. Thus, the light having the non-diffracted wavelet proceeds toward the viewing area. Thus, wavelet diffraction caused by the light-transmissive area may be reduced.

26 Claims, 15 Drawing Sheets

FIG. 6

DISPLAY DEVICE

CROSS-REFERENCE TO RELATED APPLICATION

This application claims priority from Korean Patent Application No. 10-2021-0188394 filed on Dec. 27, 2021, which is hereby incorporated by reference in its entirety.

BACKGROUND

Technical Field

The present disclosure relates to a display device capable of reducing wavelet diffraction that may occur due to a light-transmissive area.

Description of the Related Art

A display device may be implemented in various forms, such as a liquid crystal display device (LCD), an organic light-emitting display device (OLED), a micro LED display device, and the like.

The organic light-emitting display device includes an organic light-emitting element as a self-emissive element, and thus does not require a separate light source, thereby greatly reducing a thickness and a weight of the display device. The organic light-emitting display device may have a structure in which an organic light-emitting element for emitting light is disposed between an anode electrode and a cathode electrode. An area in which the organic light-emitting element contacts the anode electrode and the cathode electrode may be a light-emitting area.

The organic light-emitting display device may be classified into a bottom emission OLED in which light emitted from the light-emitting area travels toward a substrate, a top emission OLED in which light emitted from the light-emitting area travels in a direction away from the substrate, a dual emission OLED in which light emitted from the light-emitting area travels toward the substrate and in a direction away from the substrate, and a transparent OLED.

Since the transparent display device may include the light-transmissive area and the light-emitting area from which light is emitted, a viewer may view both the light-emitting area where a screen is realized and a background area viewed through the light-transmissive area.

BRIEF SUMMARY

The light-emitting areas and the light-transmissive areas of the transparent display device may be arranged in a matrix form. The light-transmissive area through which the viewer recognizes the background area may serve as a slit.

Accordingly, when light traveling from the background area to a viewing area passes through the light-transmissive area, a diffraction pattern may occur due to wavelet diffraction of the light, and thus visibility of the light-transmissive area may be deteriorated.

In particular, when the background area has a dark black background or a separate light source exists, the visibility of the light-transmissive area may be further deteriorated.

Accordingly, the inventors of the present disclosure have provided a display device capable of reducing the wavelet diffraction phenomenon that may occur due to the light-transmissive area through several experiments.

One or more embodiments of the present disclosure provide a display device capable of reducing a wavelet diffraction phenomenon that may occur due to a light-transmissive area.

One or more embodiments of the present disclosure provide a display device including transmittance adjustment pattern member capable of controlling transmittance such that the wavelet diffraction may be reduced uniformly across a total area from a center to an outer edge of the light-emitting area.

One or more embodiments of the present disclosure provide a display device which induces diffraction substantially in a radial manner and thus is more advantageous in diffraction control.

One or more embodiments of the present disclosure provide a display device including transmittance adjustment pattern member having various patterns that may further improve the visibility of the light-transmissive area.

Technical benefits of the present disclosure are not limited to the above-mentioned benefits. Other benefits and advantages of the present disclosure that are not mentioned may be understood based on following descriptions, and may be more clearly understood based on embodiments of the present disclosure. Further, it will be easily understood that the benefits and advantages of the present disclosure may be realized using means shown in the claims and combinations thereof.

A display device according to an embodiment of the present disclosure includes a substrate including a light-emitting area and a light-transmissive area; at least one light-emitting element disposed on a top face of the substrate and in the light-emitting area; and transmittance adjustment pattern member disposed under the light-emitting element and in the light-emitting area and the light-transmissive area, wherein the transmittance adjustment pattern member includes a plurality of patterns arranged in the light-emitting area and the light-transmissive area.

In this regard, a distribution density of the patterns in the light-emitting area is higher than a distribution density of the patterns in the light-transmissive area.

A display device according to another embodiment of the present disclosure includes a substrate including a light-emitting area and a light-transmissive area; and transmittance adjustment pattern member disposed on one face of the substrate, wherein the transmittance adjustment pattern member includes a light-emitting area pattern portion corresponding to the light-emitting area and a light-transmissive area pattern portion corresponding to the light-transmissive area, wherein the transmittance adjustment pattern member includes patterns.

In this regard, a distribution density of the patterns arranged in the light-emitting area pattern portion is higher than a distribution density of the patterns arranged in the light-transmissive area pattern portion.

According to an embodiment of the present disclosure, the transmittance adjustment pattern member including the plurality of patterns is disposed on one face of the substrate and in the light-emitting area and the light-transmissive area such that a distribution density of the patterns in the light-emitting area is higher than a distribution density of the patterns in the light-transmissive area.

Accordingly, while the light generated in the background area passes through the transmittance adjustment pattern member, light may be first inversely-diffracted such that a wavelength thereof may be converted into an inversely-diffracted wavelet. Then, the light having the inversely-diffracted wavelet passes through the light-transmissive area, and thus the inversely-diffracted wavelet may be eventually converted into a non-diffracted wavelet. Thus, the light having the non-diffracted wavelet proceeds toward the viewing area. Thus, the viewer may recognize an image of the background area having reduced wavelet diffraction.

According to an embodiment of the present disclosure, the plurality of patterns are arranged in at least one of a distribution density increasing manner in which a distribution density increases in one direction and a distribution density decreasing manner in which a distribution density decreases in one direction. Thus, the transmittance adjustment pattern member may be capable of controlling transmittance such that the wavelet diffraction may be reduced uniformly across a total area from a center to an outer edge of the light-emitting area.

According to an embodiment of the present disclosure, the patterns arranged in the distribution density increasing pattern section and the distribution density decreasing pattern section are arranged in a circular manner, thereby suppressing generation of an axis causing the diffraction and causing the diffraction to occur substantially in the radial manner. This may be advantageous in diffraction control.

According to an embodiment of the present disclosure, in the light-emitting area pattern portion, the patterns are arranged in a donut shape having a hollow. Thus, the diffraction control may be more effectively achieved, and the visibility of the light-transmissive area may be further improved.

Effects of the present disclosure are not limited to the above-mentioned effects, and other effects as not mentioned will be clearly understood by those skilled in the art from following descriptions.

BRIEF DESCRIPTION OF THE SEVERAL VIEWS OF THE DRAWINGS

FIG. 6 shows a plan view and a cross-sectional view of each of Comparative Example free of transmittance adjustment pattern member and Present Examples including transmittance adjustment pattern member.

Figure 7:
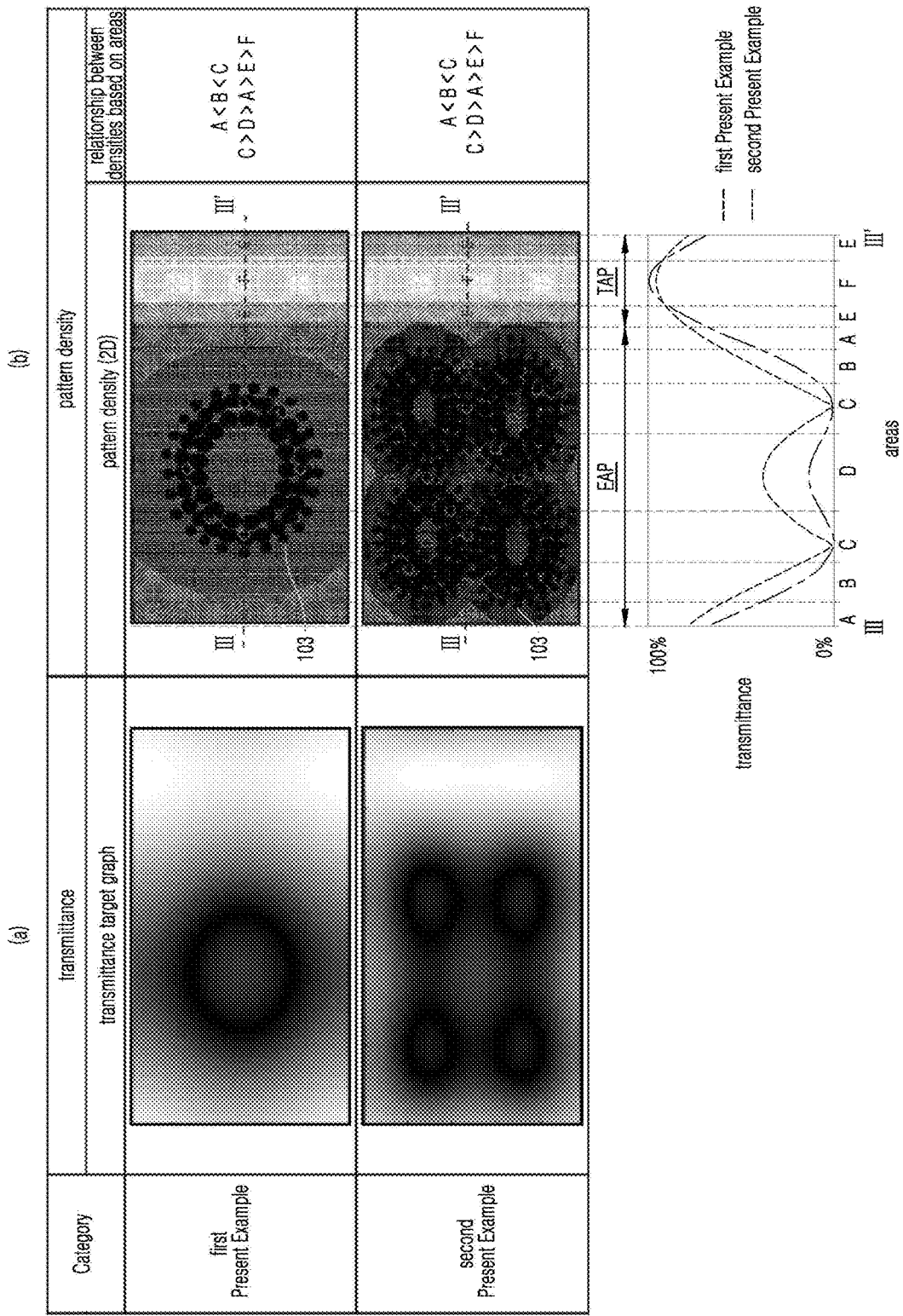

(a) of FIG. 7 shows a target graph for transmittance control of a first Present Example and a second Present Example, and (b) in FIG. 7 shows a schematic diagram of transmittance control via arrangement of patterns.

Figure 8:
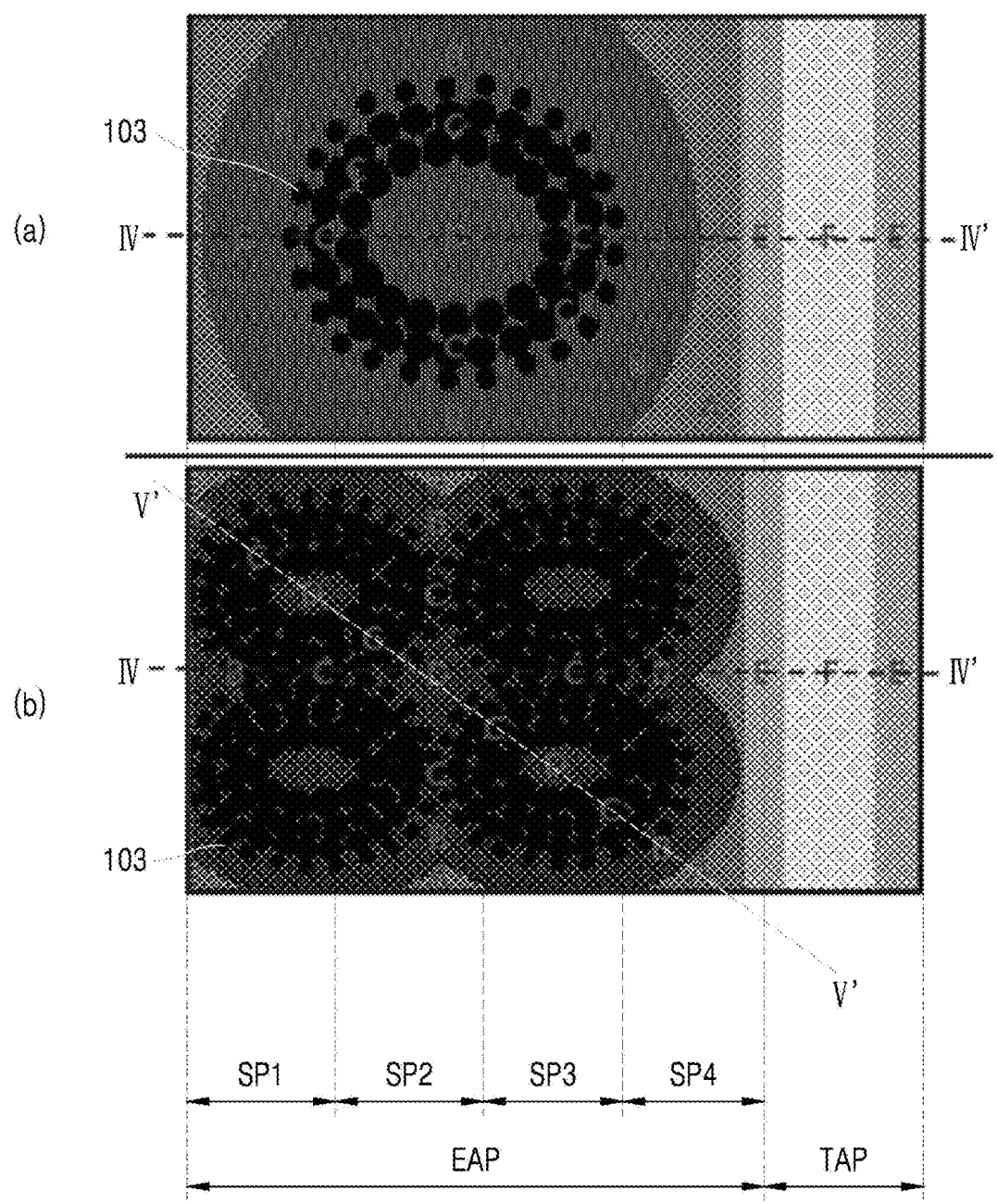

FIG. 8 shows an embodiment of a pattern arrangement of the transmittance adjustment pattern member in each of a light-emitting area and a light-transmissive area according to an embodiment of the present disclosure.

Figure 9:
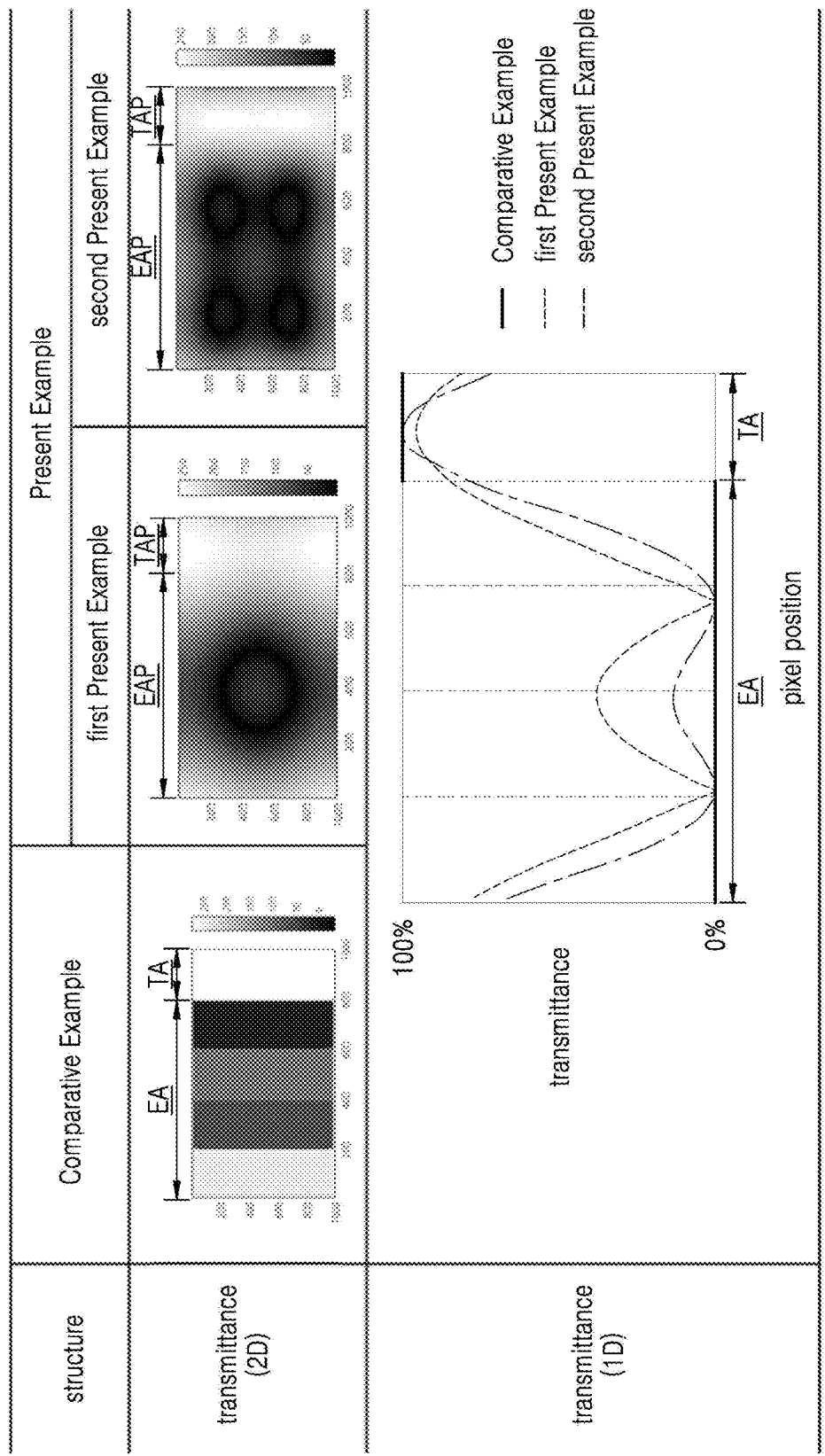

FIG. 9 shows comparison between transmittance of Comparative Example free of transmittance adjustment pattern member and transmittance of each of Present Examples including transmittance adjustment pattern member.

Figure 6:
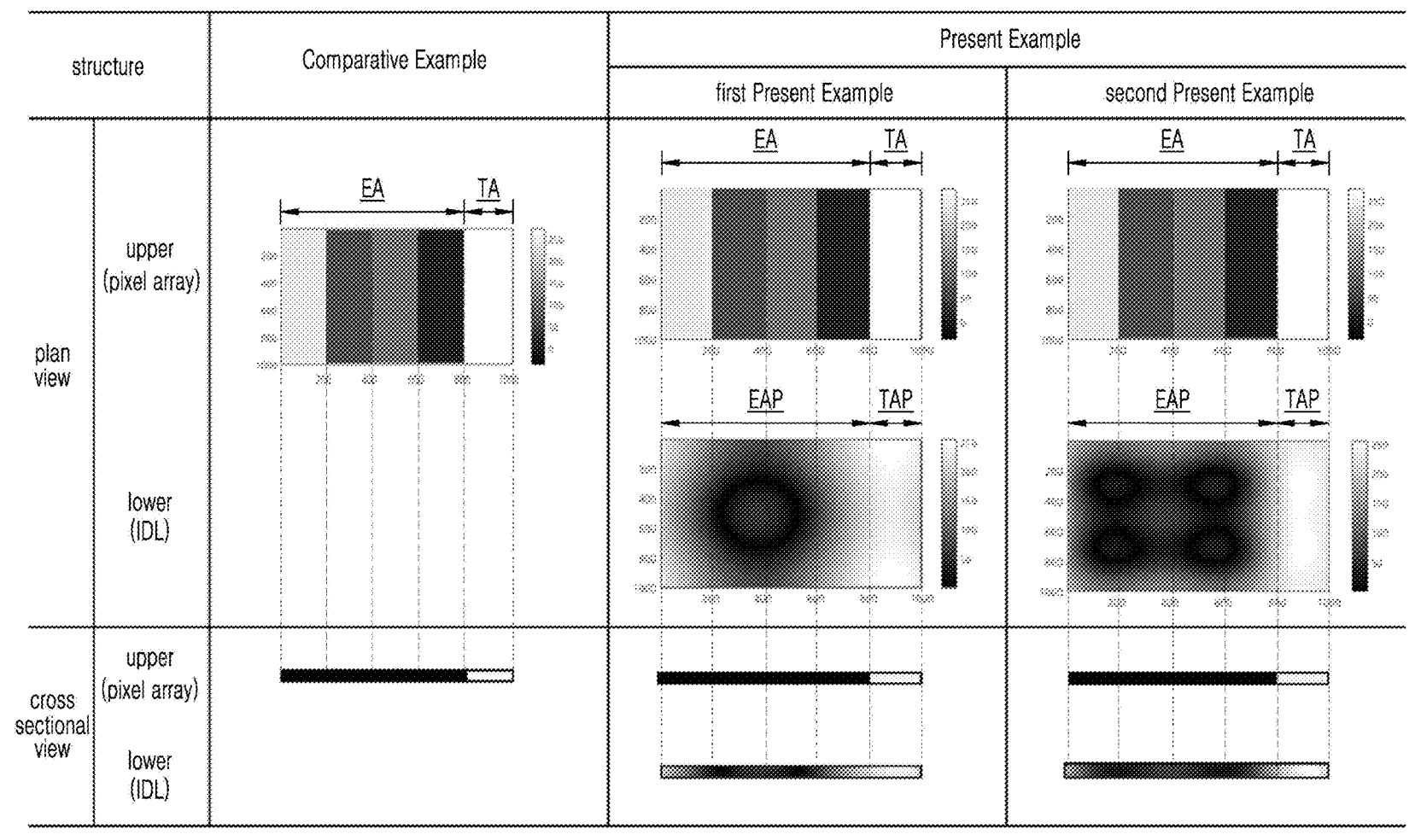
Figure 10:
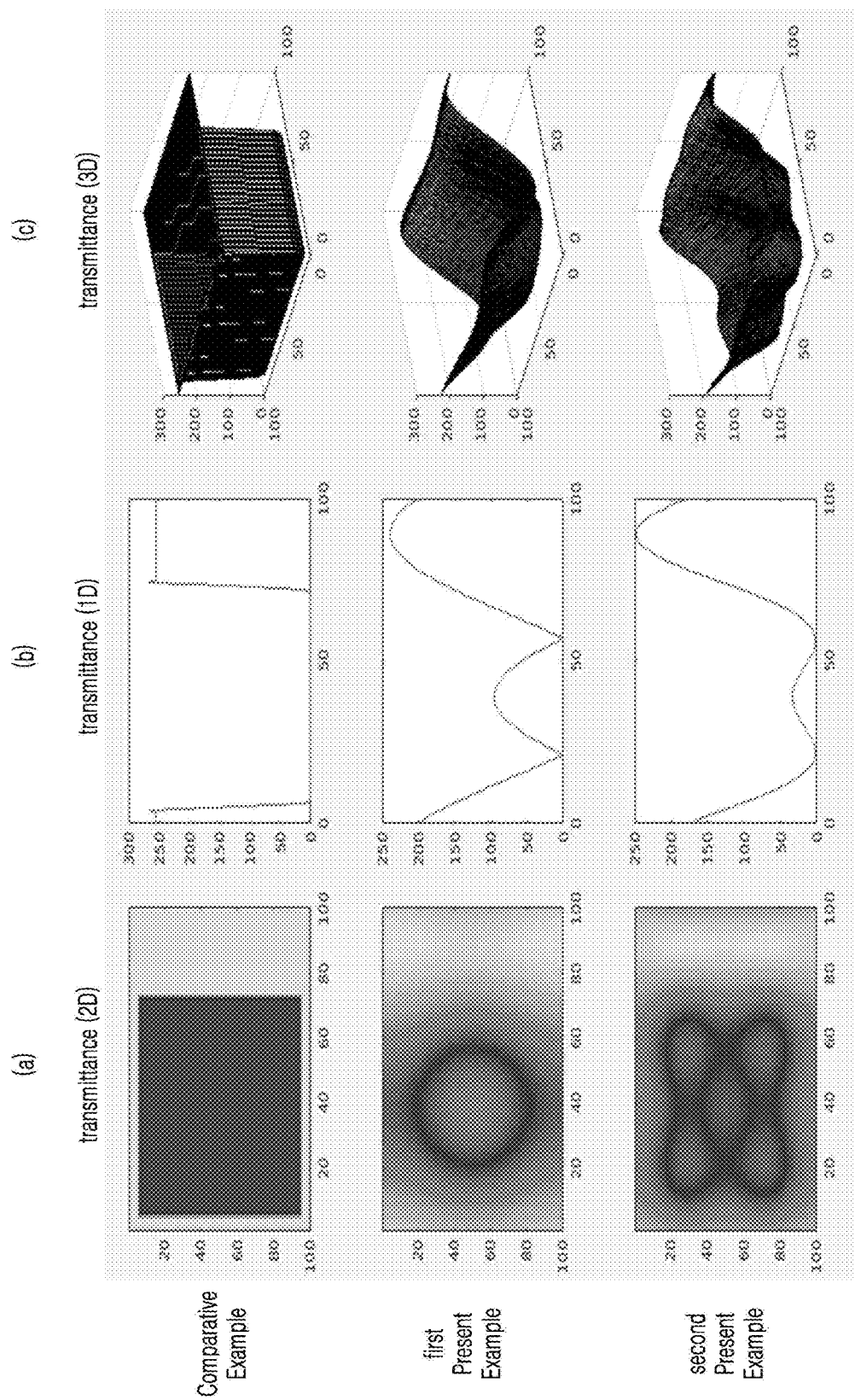

FIG. 10 shows comparison between transmittance of Comparative Example not including transmittance adjustment pattern member according to FIG. 6 and transmittance of each of Present Examples including the transmittance adjustment pattern member according to FIG. 6.

Figure 11:
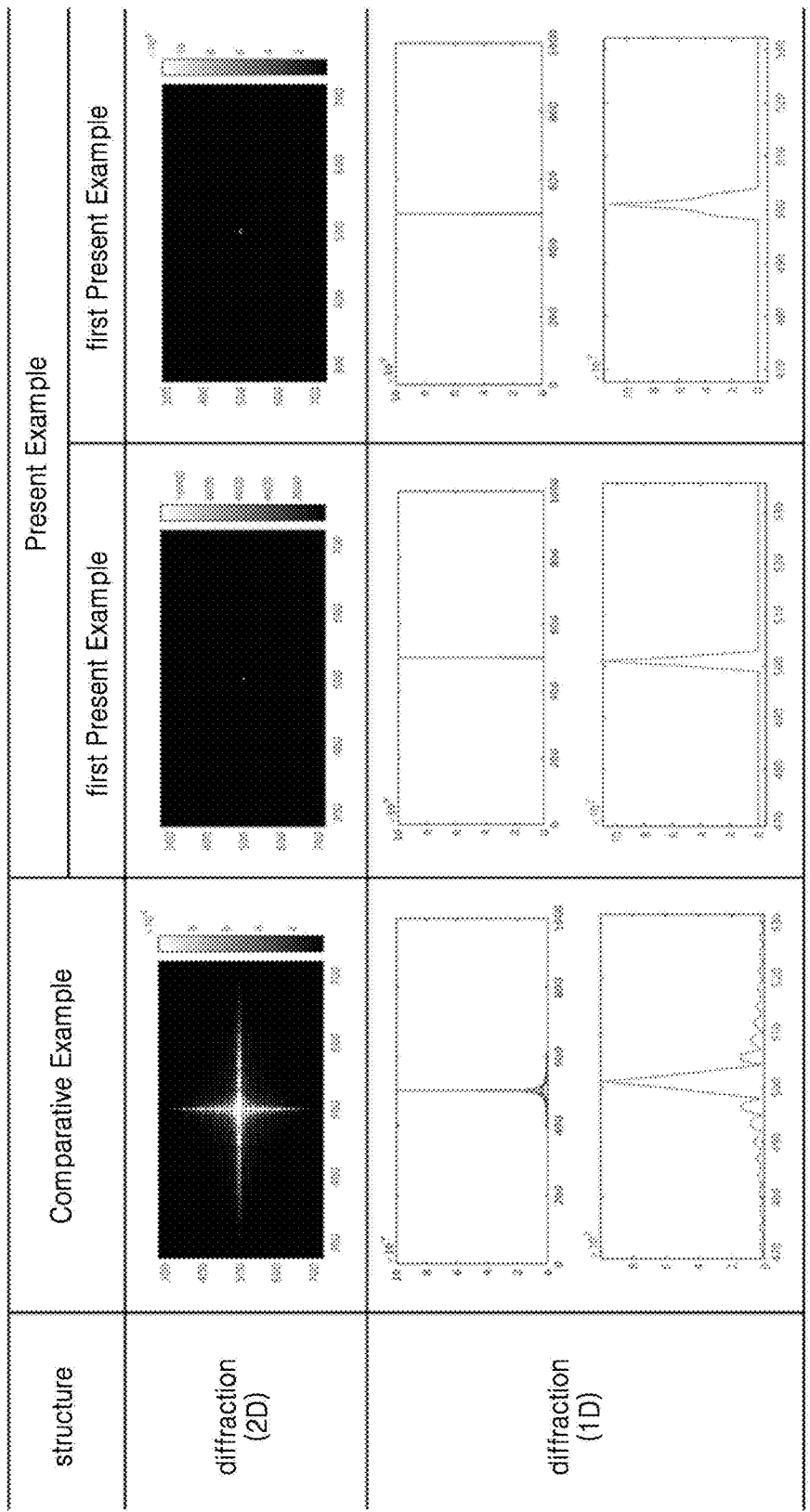

FIG. 11 shows comparison between diffraction phenomenon of Comparative Example not including transmittance adjustment pattern member according to FIG. 6 and diffraction phenomenon of each of Present Examples including the transmittance adjustment pattern member according to FIG. 6.

Figure 12:
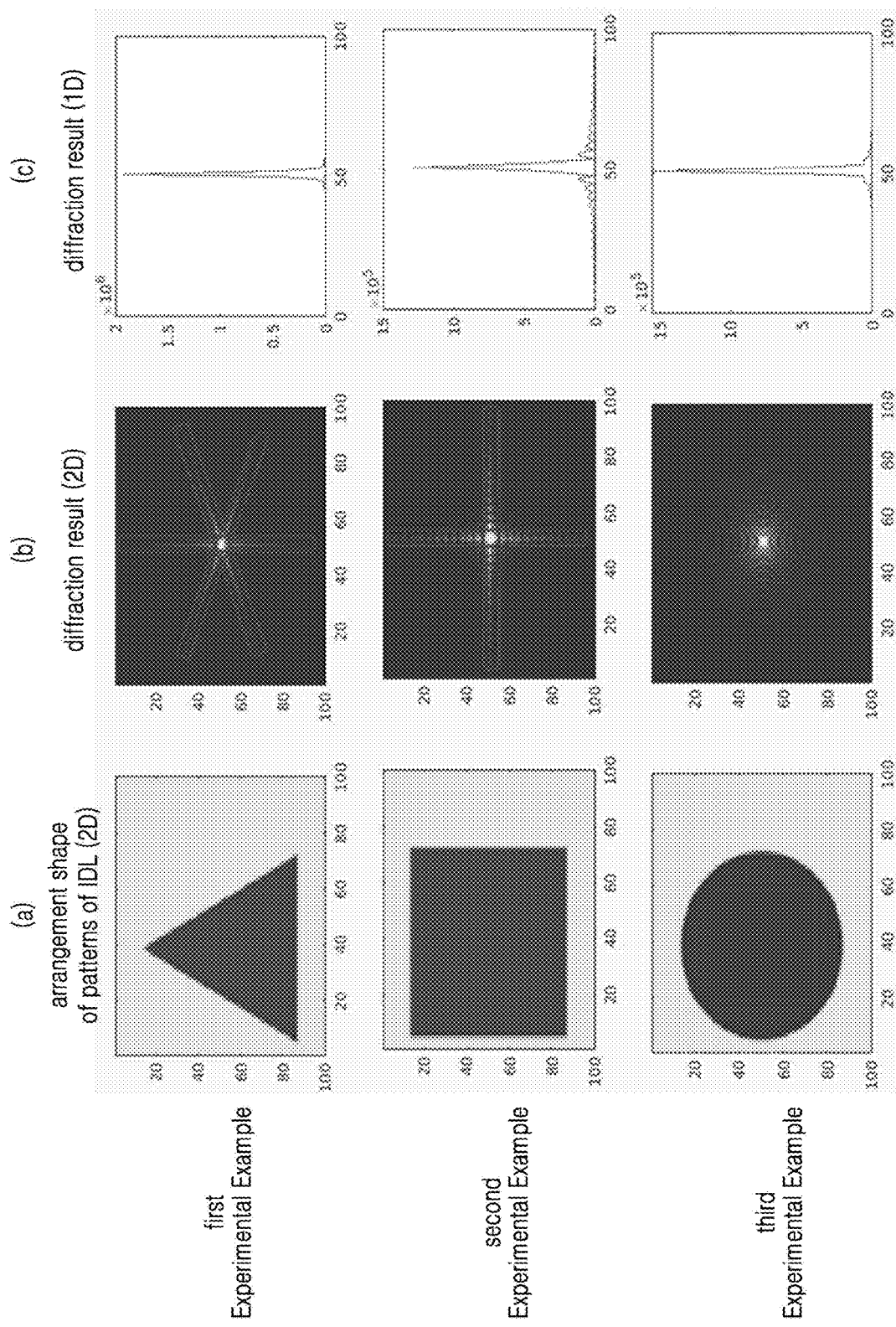
Figure 13:
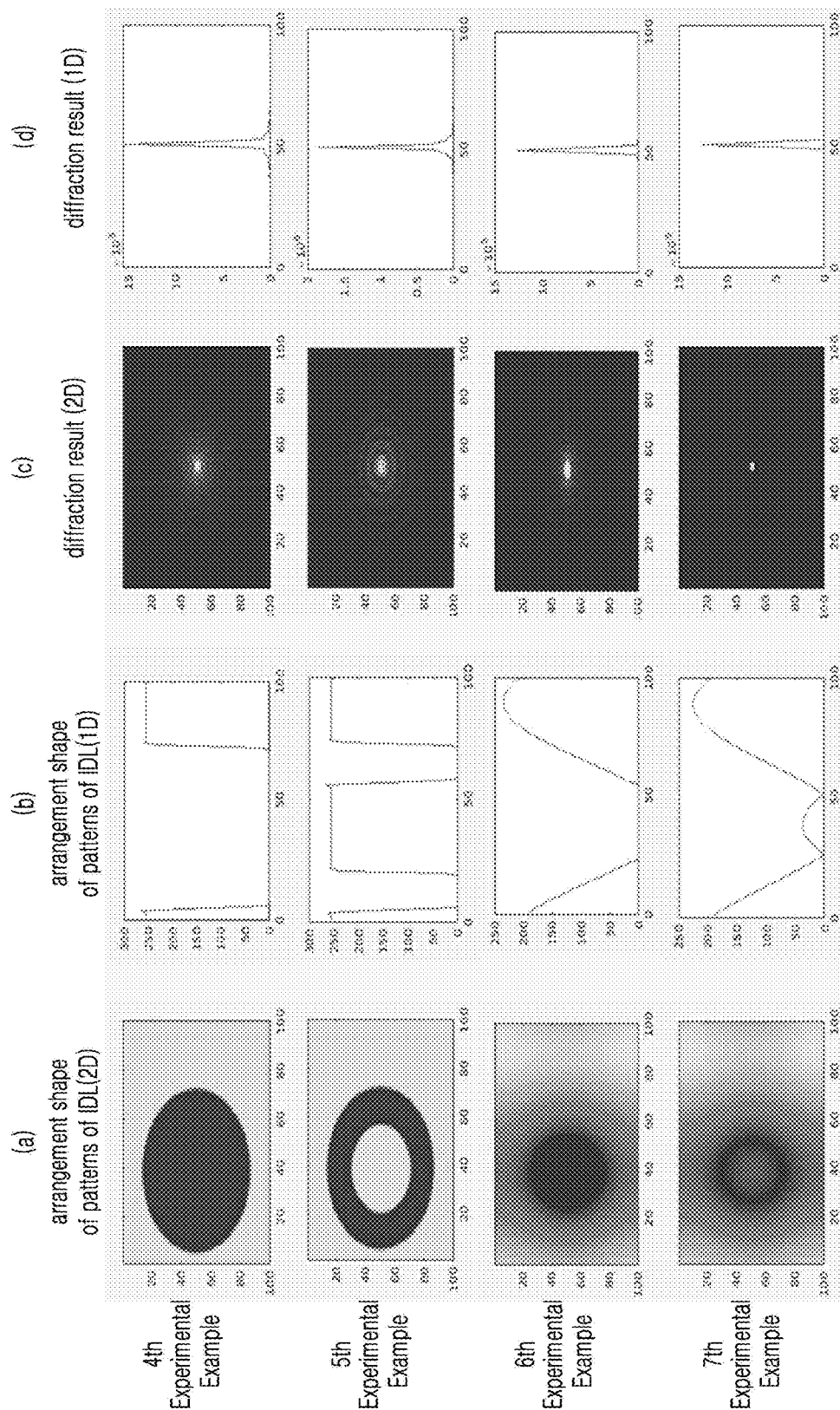

FIG. 12 and FIG. 13 show the diffraction results based on various arrangement shapes of patterns in the light-emitting area pattern portion.

Figure 14A:
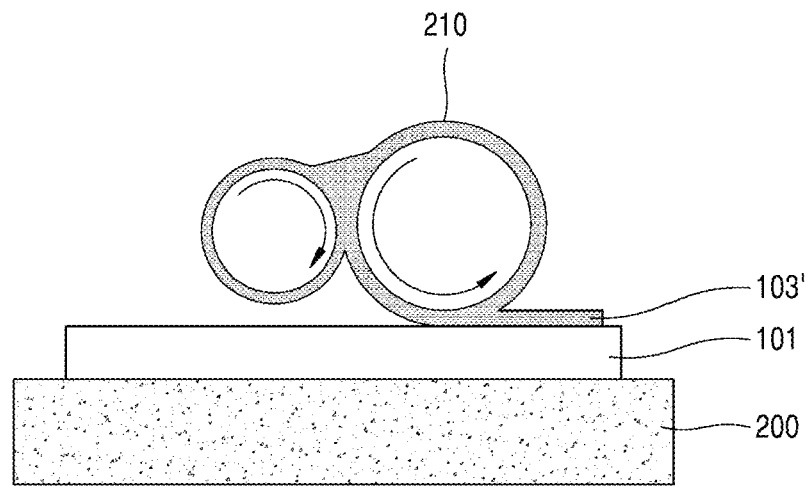
Figure 14B:
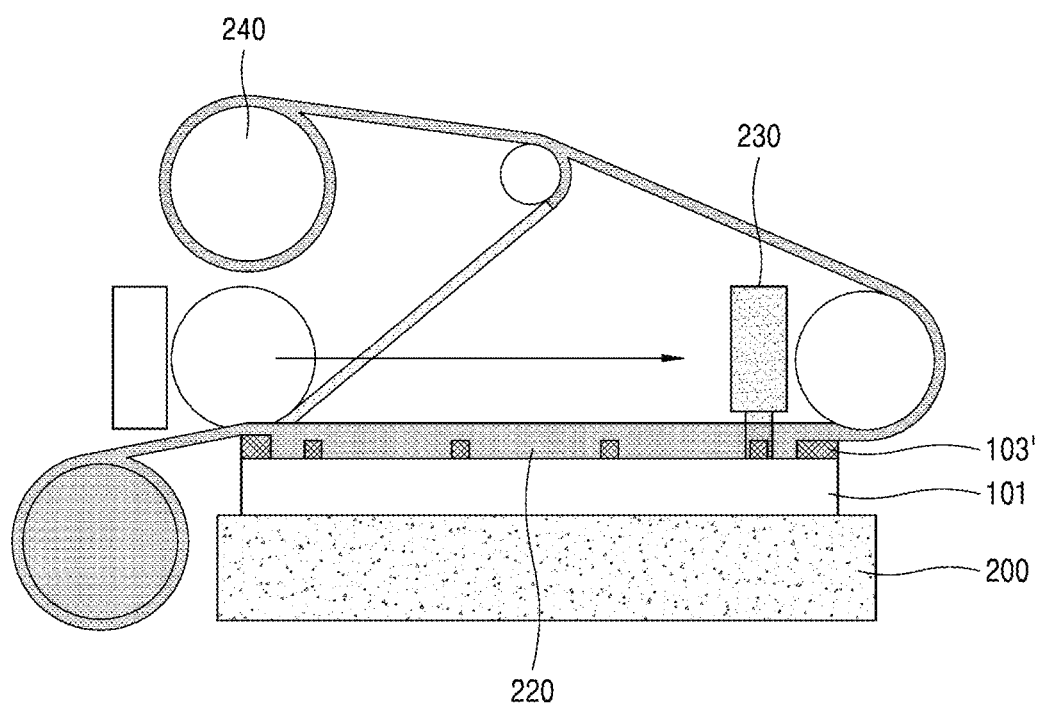
Figure 14C:
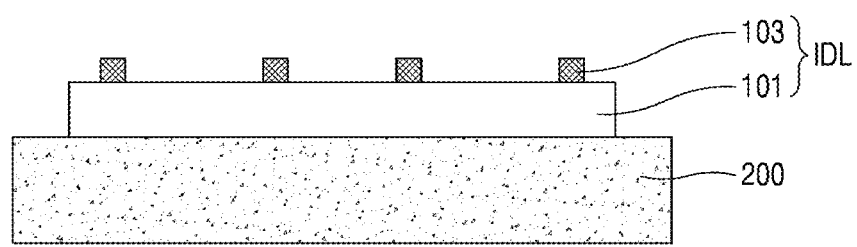

FIG. 14A to FIG. 14C are process diagrams of forming transmittance adjustment pattern member according to an embodiment of the present disclosure.

DETAILED DESCRIPTIONS

Advantages and features of the present disclosure, and a method of achieving the advantages and features will become apparent with reference to embodiments described later in detail together with the accompanying drawings. However, the present disclosure is not limited to embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc., disclosed in the drawings for describing the embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship. In interpreting a numerical value, the value is interpreted as including an error range unless there is no separate explicit description thereof. In descriptions of temporal relationships, for example, temporal precedent relationships between two events such as "after," "subsequent to," "before," etc., another event may occur therebetween unless "directly after," "directly subsequent" or "directly before" is not indicated.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, various configurations of a display device capable of reducing a wavelet diffraction phenomenon that may occur due to a light-transmissive area will be described in detail.

Figure 1:
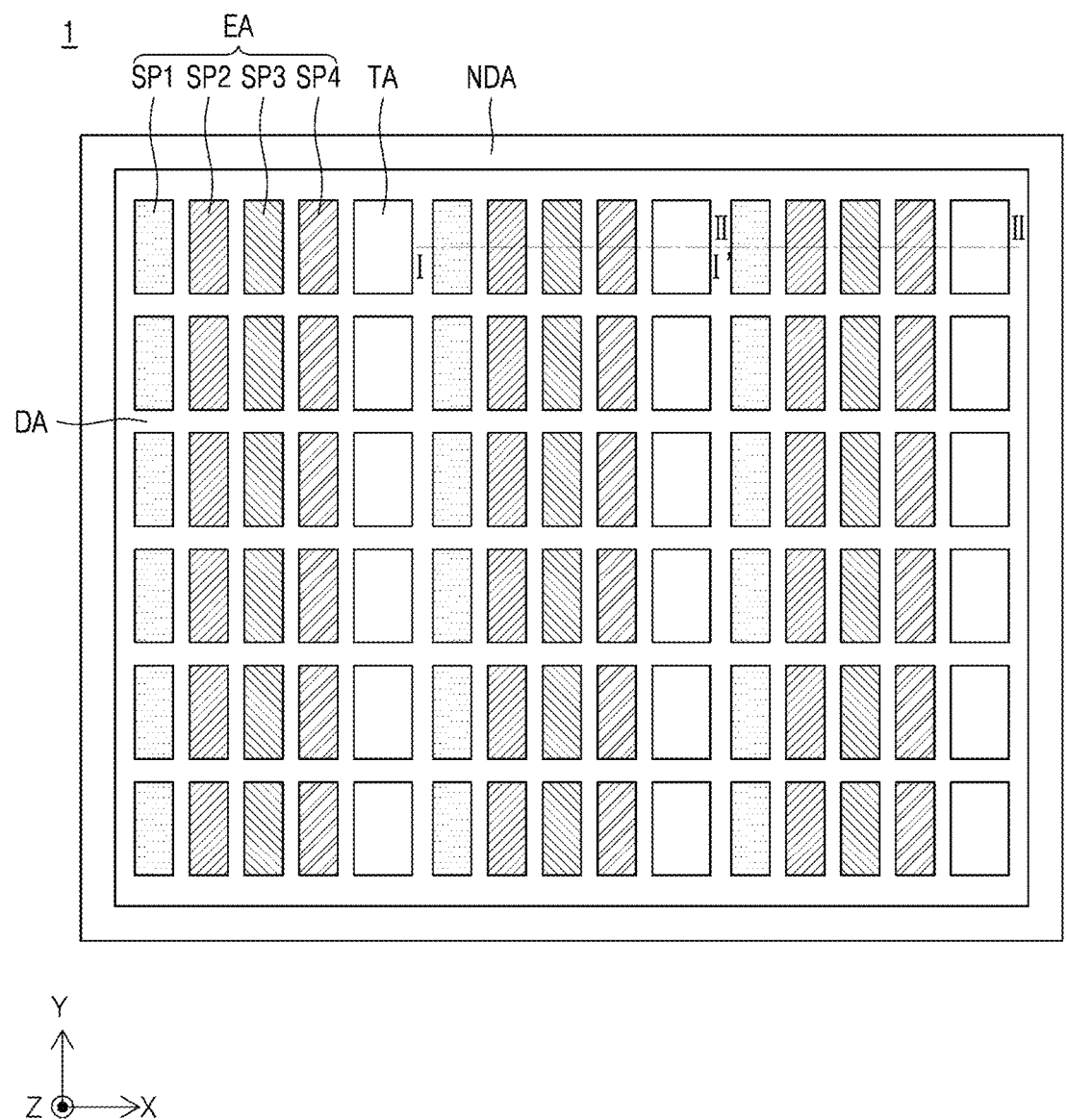
FIG. 1 is a plan view of a display device according to an embodiment of the present disclosure.

FIG. 1 is a plan view of a display device according to an embodiment of the present disclosure.

Hereinafter, an example in which the display device is embodied as a transparent organic light-emitting display device (OLED) including a light-transmissive area and a light-emitting area including an organic light-emitting element will be described. However, the display device according to an embodiment of the present disclosure is not limited thereto.

A display device 1 may include a lower substrate 110, and the lower substrate 110 may include a display area DA and a non-display area NDA disposed to surround the display area DA.

The display area DA may include at least one light-emitting area EA and at least one light-transmissive area TA arranged in a matrix form.

For example, the light-emitting area EA may include a first sub-pixel SP1, a second sub-pixel SP2, a third sub-pixel SP3, and a fourth sub-pixel SP4 rendering white W, red R, green G, and blue B colors, respectively. However, the present disclosure is not limited thereto. The light-emitting area EA may include a first sub-pixel SP1, a second sub-pixel SP2, and a third sub-pixel SP3 rendering red R, green G, and blue B colors, respectively.

Figure 2:
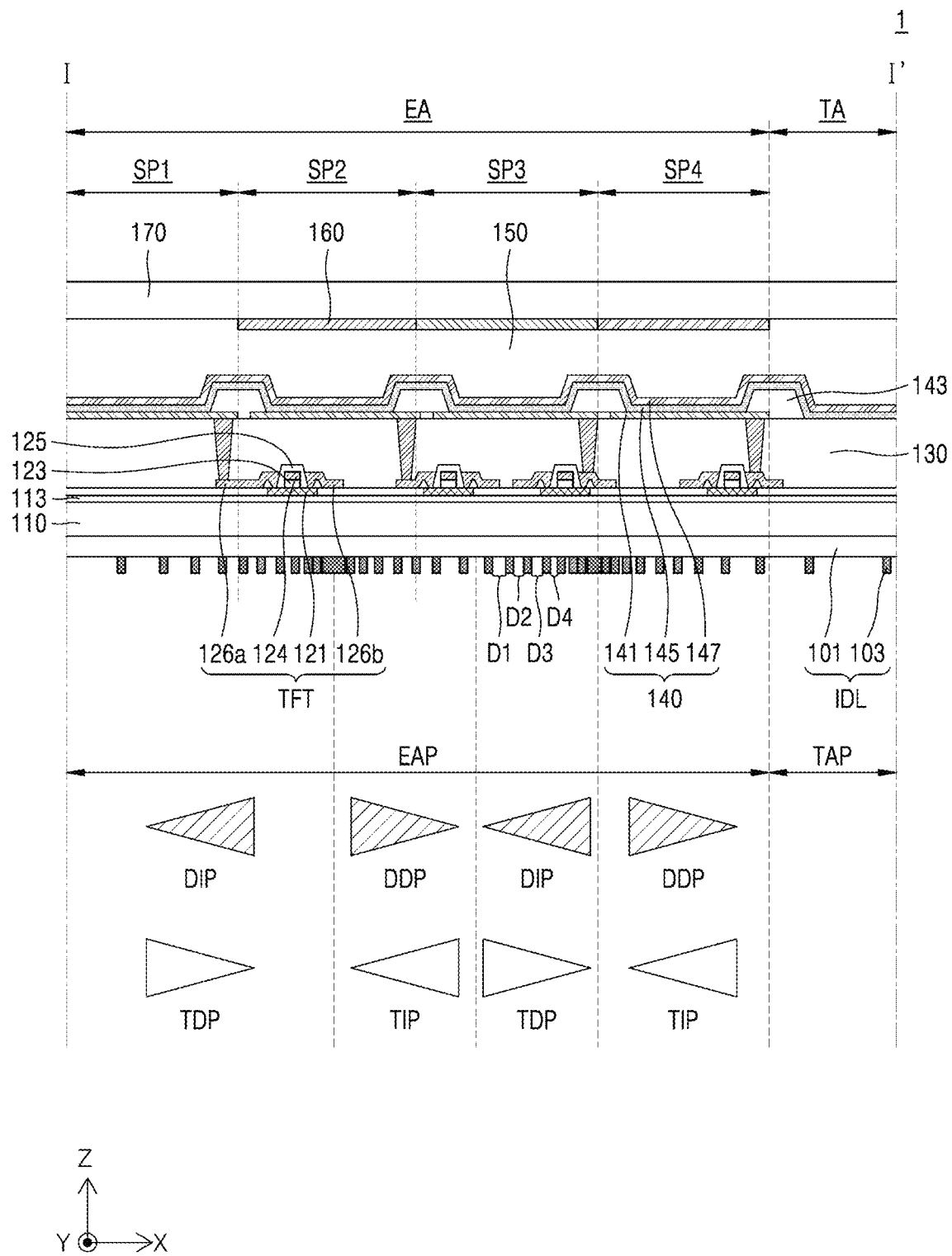
FIG. 2 is a cross-sectional view of a display device according to an embodiment of the present disclosure.
Figure 3:
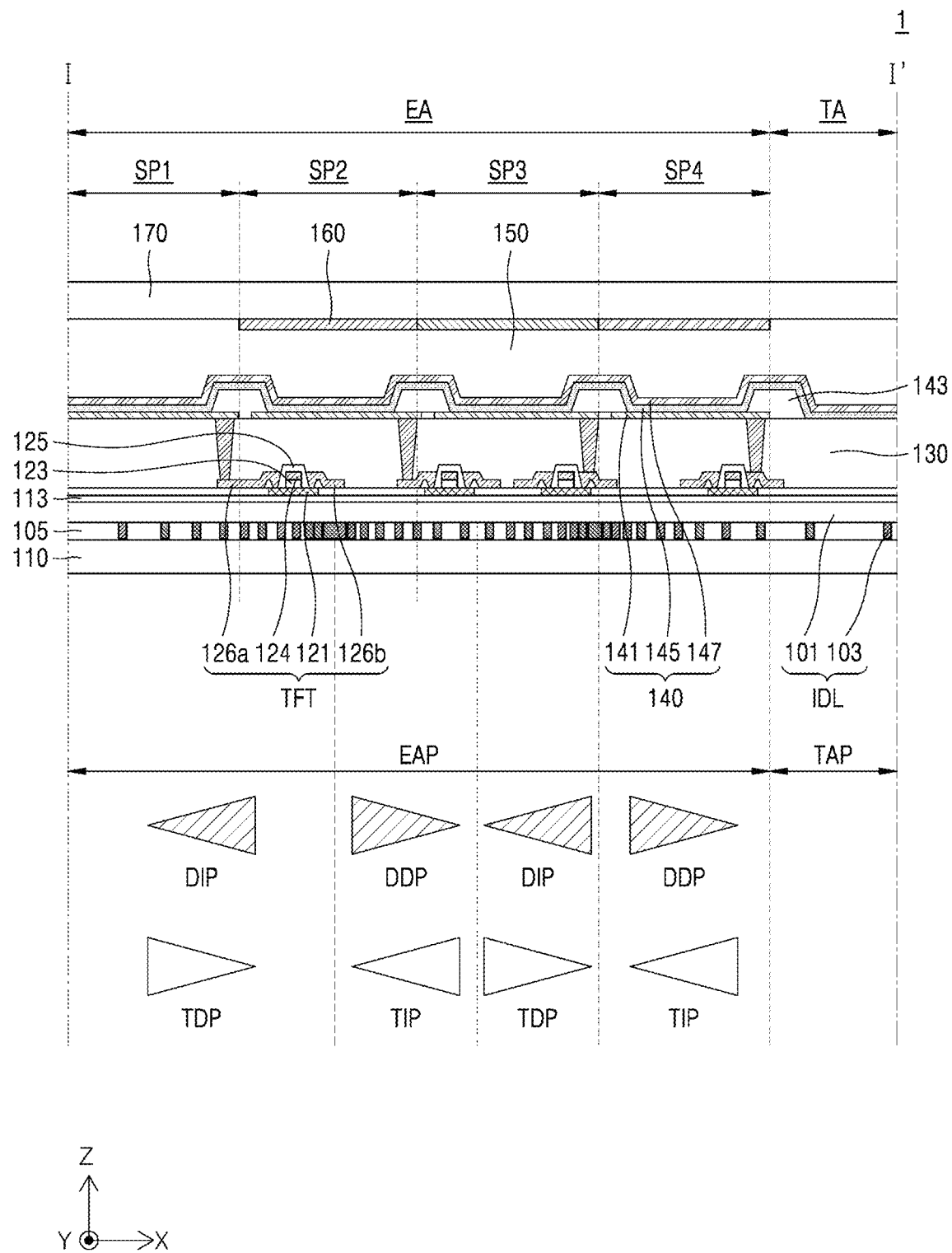
FIG. 3 is a cross-sectional view of a display device according to another embodiment of the present disclosure.

FIGS. 2 and 3 are cross-sectional views of display devices according to various embodiments of the present disclosure.

The lower substrate 110 may act as a base substrate of the display device 1, and may be embodied as a glass substrate. However, the present disclosure is not limited thereto, and a polyimide substrate having flexibility may be used as the lower substrate 110.

The lower substrate 110 may include a light-emitting area EA and a light-transmissive area TA.

A thin-film transistor TFT and a light-emitting element 140 may be disposed in the light-emitting area EA.

The thin-film transistor TFT including an active layer 121, a gate electrode 124, a first electrode 126a, and a second electrode 126b may be disposed on the lower substrate 110 and in the light-emitting area EA.

A buffer layer 113 may be disposed between the lower substrate 110 and the thin-film transistor TFT.

A gate insulating layer 123 capable of electrically insulating the active layer 121 and the gate electrode 124 from each other may be disposed between the active layer 121 and the gate electrode 124.

An interlayer insulating layer 125 may be disposed on the active layer 121 and the gate electrode 124, and an overcoat layer 130 may be disposed on the interlayer insulating layer 125.

The first electrode 126a and the second electrode 126b may be electrically connected to the active layer 121 via contact holes extending through the interlayer insulating layer 125, respectively.

The first electrode 126a may act as a source electrode, and the second electrode 126b may act as a drain electrode.

However, the present disclosure is not limited thereto. The roles thereof may be changed according to a signal input direction.

A light-emitting element 140 electrically connected to the thin-film transistor TFT, and including an anode electrode 141, a light-emitting layer 145, and a cathode electrode 147 may be disposed on the thin-film transistor TFT.

The overcoat layer 130 may be disposed between the thin-film transistor TFT and the anode electrode 141.

The overcoat layer 130 may function as a planarization layer. Thus, the electrodes and layers disposed thereon may be uniformly formed on a planarized surface thereof.

The anode electrode 141 may be electrically connected to the thin-film transistor TFT via a contact hole extending through the overcoat layer 130.

Light is emitted from an area where the anode electrode 141, the light-emitting layer 145, and the cathode electrode 147 overlap each other. Thus, the area may act as the light-emitting area EA.

Across the pixels, the light-emitting layer 145 may emit light of the same color such as white light. Alternatively, across the pixels, the light-emitting layer 145 may emit light of different colors such as red, green, and blue light.

For example, the light-emitting layer 145 may be embodied as an organic light-emitting layer.

Herein, an example in which the light-emitting area EA includes the first sub-pixel SP1, the second sub-pixel SP2, the third sub-pixel SP3, and the fourth sub-pixel SP4 rendering white W, red R, green G, and blue B colors, respectively will be described.

A bank layer 143 is disposed at a boundary between adjacent sub-pixels, so that mixing between colors of sub-pixels rendering different colors may be reduced.

A sealing layer 150 is disposed on the light-emitting element 140 to reduce penetration of moisture and foreign substances into the light-emitting layer 145.

A color filter layer 160 in which color filters are arranged in a corresponding manner to sub-pixels and render corresponding colors may be disposed on the sealing layer 150.

For example, in the color filter layer 160, color filters may be arranged in a corresponding manner to the second sub-pixel SP2 to render a red color, the third sub-pixel SP3 to render a green color, and the fourth sub-pixel SP4 to render a blue color.

In this case, the color filter layer 160 may be absent in an area corresponding to the first sub-pixel SP1 rendering a white color.

An upper substrate 170 may be disposed on the color filter layer 160 so as to face away the lower substrate 110.

In the light-transmissive area TA, layers having high light transmittance may be disposed to transmit light therethrough.

For example, in the light-transmissive area TA, insulating layers made of an organic or inorganic material such as the buffer layer 113, the interlayer insulating layer 125, and the overcoat layer 130 may be disposed on the lower substrate 110. In the light-transmissive area TA, the light-emitting layer 145 and the cathode electrode 147 may be disposed on the overcoat layer 130.

Since the light is emitted from the area where the anode electrode 141, the light-emitting layer 145, and the cathode electrode 147 overlap each other, light is not emitted from the light-transmissive area TA in which the anode electrode 141 is not disposed.

In order to increase light transmittance of the light-transmissive area TA, the cathode electrode 147 may be made of a transparent conductive oxide (TCO) such as, for example, ITO (Indium Tin Oxide), IZO (Indium Zinc Oxide), ITZO (Indium Tin Zinc Oxide), etc.

The sealing layer 150 and the upper substrate 170 may be disposed on the cathode electrode 147 in the light-transmissive area TA.

The upper substrate 110 may be embodied as a glass substrate. However, the present disclosure is not limited thereto. A polyimide substrate having flexibility may be used as the upper substrate.

As described above, the display device 1 according to an embodiment of the present disclosure may include the lower substrate 110 including the light-emitting area EA and the light-transmissive area TA, and one or more light-emitting elements 140 disposed on the lower substrate 110 and in the light-emitting area EA.

Further, the display device 1 according to an embodiment of the present disclosure may include transmittance adjustment pattern member IDL which is disposed under the light-emitting element 140 and in the light-emitting area EA and the light-transmissive area TA, and includes a plurality of patterns 103.

In one embodiment, the transmittance adjustment pattern member IDL may include a base layer 101 and the plurality of patterns 103 disposed on one face of the base layer 101. In some instances, the plurality of patterns 103 may be arranged in a selected pattern or in some predefined manner. However, the disclosure is not limited thereto and the plurality of patterns of the transmittance adjustment pattern member IDL may be arranged in any manner such that it achieves the technical benefits as set forth in, for example, FIG. 5.

The base layer 101 may be made of a plastic material having transparency. For example, the base layer 101 may include polycarbonate (PC) or polyethylene terephthalate (PET).

Each of the patterns 103 may be made of a material capable of absorbing light. For example, each of the patterns 103 may include black resin.

Each of the plurality of patterns 103 may be formed in a dot shape. The patterns 103 may be arranged to be spaced apart from each other by a selected distance in some areas, while adjacent patterns 103 may be disposed to contact each other in other areas (e.g., distance between adjacent patterns 103 is zero).

For example, the dot shape in the present disclosure may be a column shape having various cross-sectional shapes such as a circular cross-sectional shape or a polygonal cross-sectional shape. However, the present disclosure is not limited thereto, and the dot shape may have various shapes.

Further, the plurality of patterns 103 may be formed to have the same size. However, the present disclosure is not limited thereto. The plurality of patterns 103 may be formed to have different sizes.

A spacing between adjacent patterns 103 in the light-transmissive area TA may be 1 µm or larger.

Since diffraction may be induced when a size of the light-transmissive area TA is similar to a wavelength band of visible light, that is, 400 nm to 800 nm, a spacing between the adjacent patterns 103 formed in the light-transmissive area TA may be 1 µm or greater and thus may be larger than the wavelength band of visible light, thereby reducing the diffraction phenomenon.

FIG. 14A to FIG. 14C shows a process diagram for a process of forming transmittance adjustment pattern member IDL according to an embodiment of the present disclosure.

Referring to FIG. 14A, the base layer 101 made of polycarbonate (PC) may be formed on a stage 200, and a black resin layer 103' may be formed on the base layer 101 using a first roller 210.

Next, referring to FIG. 14B, a mold 220 having patterns to be implemented may be formed on the black resin layer 103' using a second roller 240 in an imprinting scheme. Then, an ultraviolet ray-based curing device 230 may be used to irradiate ultraviolet light to the black resin layer 103' such that the black resin layer 103' may be cured into the patterns to be realized.

Next, referring to FIG. 14C, when the mold 220 formed on the black resin layer 103' is removed therefrom, the transmittance adjustment pattern member IDL including the base layer 101 and the plurality of patterns 103 disposed on one face of the base layer 101 and arranged in a selected or predefined manner may be formed.

The process for forming the transmittance adjustment pattern member IDL as described above is merely an example. In another example, the transmittance adjustment pattern member IDL may be formed by various processes such as a roll-to-roll process as well as a roll-to-plate process.

The transmittance adjustment pattern member IDL including the base layer 101 and the plurality of patterns 103 may be attached and fixed to one face of the lower substrate 110 of the display device 1.

For example, an adhesive layer may be formed on one face of the base layer 101 and then, the base layer 101 may be fixed to one face of the lower substrate 110 of the display device 1 via the adhesive layer.

Referring to FIG. 2, the transmittance adjustment pattern member IDL may be disposed on a bottom face of the lower substrate 110.

Accordingly, the bottom face of the lower substrate 110 may be in contact with the base layer 101, and the plurality of patterns 103 may face downwardly of the lower substrate 110.

Referring to FIG. 3, in another embodiment, the transmittance adjustment pattern member IDL may be disposed between the lower substrate 110 and the light-emitting element 140 and thus may be disposed on a top face of the lower substrate 110.

For example, the transmittance adjustment pattern member IDL may be disposed between the lower substrate 110 and the buffer layer 113.

In this case, a bottom face of the buffer layer 113 may be in contact with the base layer 101, and the plurality of patterns 103 may be disposed between the lower substrate 110 and the base layer 101.

An overcoat material 105 may be disposed between adjacent ones of the plurality of patterns 103 so that the layers formed on the transmittance adjustment pattern member IDL may be formed on a planarized face thereof.

As described above, according to the embodiment of the present disclosure, the transmittance adjustment pattern member IDL may be manufactured by a separate single product manufacturing process and then may be fixedly attached to the display device 1 using the base layer 101 including the adhesive layer. Thus, the transmittance adjustment pattern member IDL of the device 1 may be quickly and easily formed.

In still another embodiment, the transmittance adjustment pattern member IDL may include only the plurality of patterns 103 and may be free of a separate base layer.

In this case, the transmittance adjustment pattern member IDL may be formed directly on one face of the lower substrate 110.

For example, the plurality of patterns 103 arranged in a selected or other predefined manner may be formed on one face of the lower substrate 110 in a printed manner.

As described above, according to still another embodiment of the present disclosure, the transmittance adjustment pattern member IDL may be formed directly on one face of the lower substrate 110 of the display device 1, instead of manufacturing the transmittance adjustment pattern member IDL using a separate single product manufacturing process and attaching the same to the lower substrate. Therefore, an additional single product manufacturing process is not required, and there is an advantage that an overall thickness of the display device 1 may be reduced as much as the base layer is removed.

The transmittance adjustment pattern member IDL may include a light-emitting area pattern portion EAP corresponding to the light-emitting area EA and a light-transmissive area pattern portion TAP corresponding to the light-transmissive area TA.

A distribution density of the plurality of patterns 103 of the light-emitting area pattern portion EAP may be higher than a distribution density of the plurality of patterns 103 of the light-transmissive area pattern portion TAP.

As used herein, the distribution density may mean a percentage of an area occupied by the patterns 103 per unit area.

For example, when sizes and shapes of the plurality of patterns 103 are the same as each other, the distribution density may be increased or decreased in proportion to the number of the patterns 103 per unit area.

Further, when the plurality of patterns 103 do not have the same size and the same shape and have different sizes or shapes from each other, the distribution density may be increased or decreased in a proportional manner not to the number of the patterns 103 per unit area, but to a total area occupied by the patterns 103 per unit area.

Accordingly, according to the present disclosure, the ratio of the area occupied by the pattern 103 per unit area of the light-emitting area EA may be higher than the ratio of the area occupied by the pattern 103 per unit area of the light-transmissive area TA.

Accordingly, according to an embodiment of the present disclosure, a wavelet diffraction phenomenon that may occur due to the light-transmissive area TA may be reduced.

Figure 4:
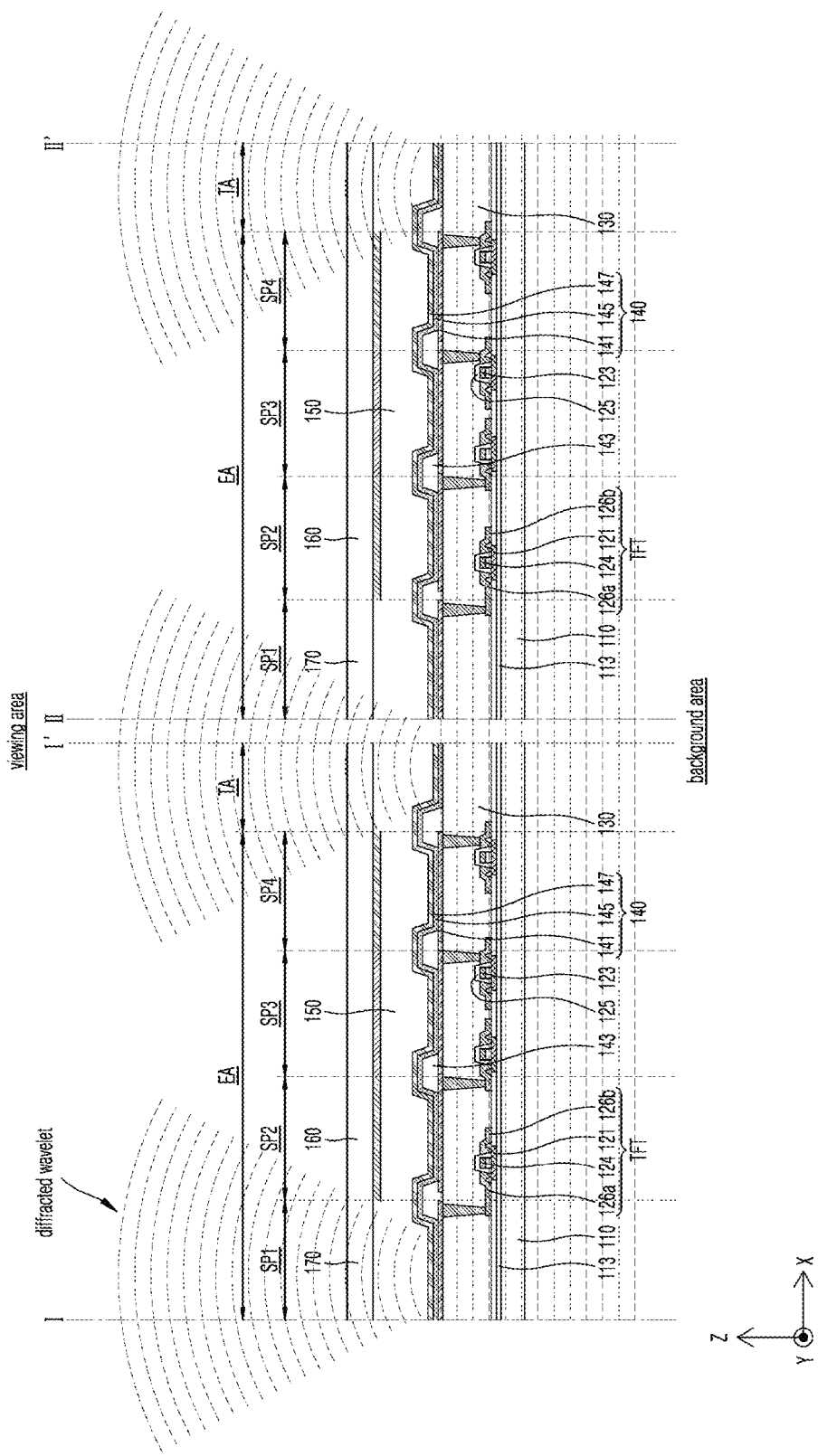
FIG. 4 shows diffraction phenomenon occurring in a display device that does not include transmittance adjustment pattern member.

FIG. 4 shows that diffraction occurs through the light-transmissive area TA in the transparent display device free of the transmittance adjustment pattern member IDL and including the light-transmissive area TA.

The light-emitting areas EA and the light-transmissive areas TA of the transparent display device may be arranged in a matrix form. The light-transmissive area TA through which the viewer is capable of recognizing the background area may serve as a slit.

Therefore, when light traveling from the background area to the viewing area passes through the light-transmissive area TA, the light wavelet diffraction causes a diffraction pattern to occur, so that the visibility of the light-transmissive area may be reduced.

Figure 5:
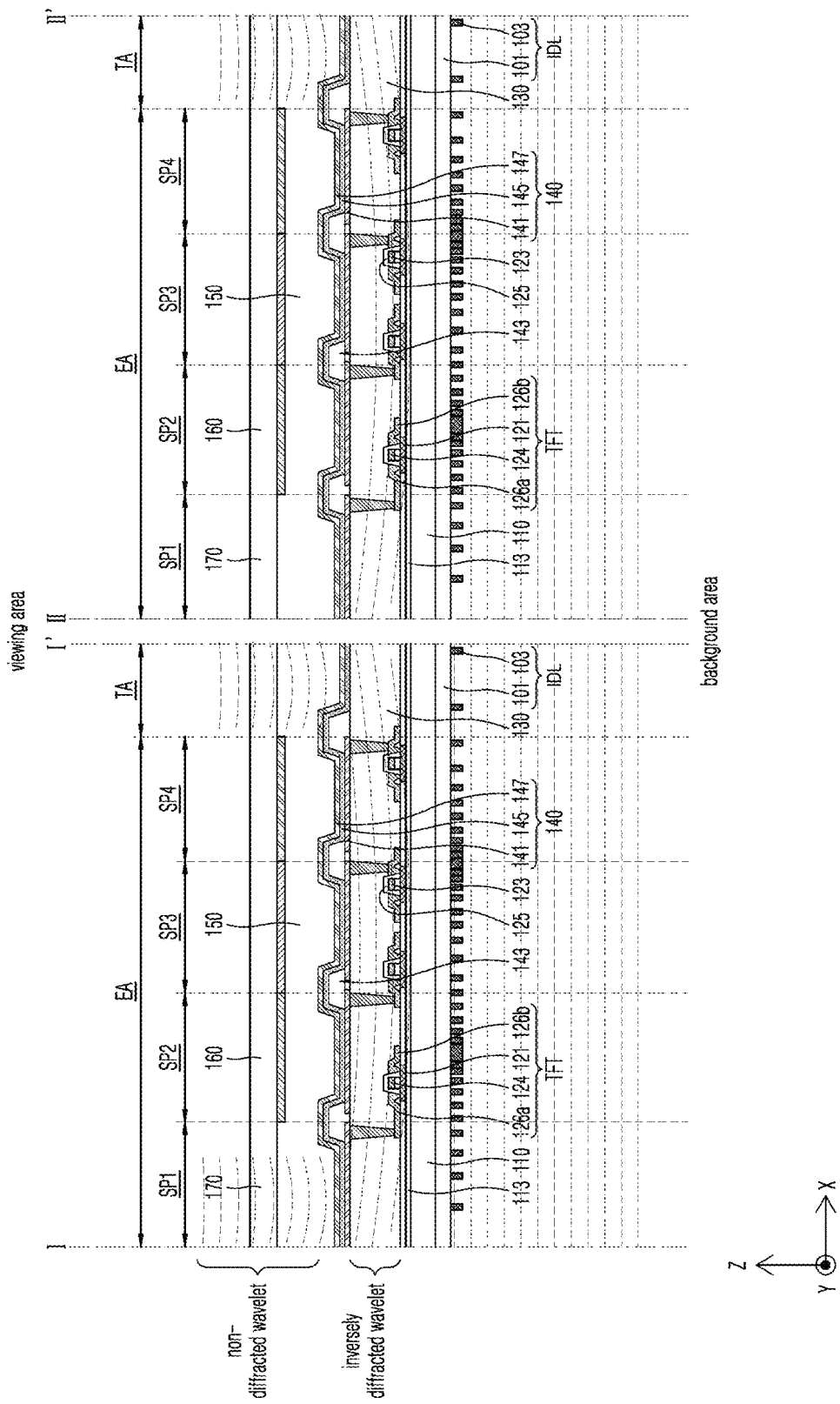
FIG. 5 shows that occurrence of diffraction phenomenon is reduced in a display device including transmittance adjustment pattern member.

On the contrary, FIG. 5 shows that the occurrence of diffraction through the light-transmissive area TA is suppressed in the transparent display device including the light-transmissive area TA and having the transmittance adjustment pattern member IDL.

While the light generated in the background area passes through the transmittance adjustment pattern member IDL, light may be first inversely-diffracted such that a wavelength thereof may be converted into an inversely-diffracted wavelet.

Then, the light having the inversely-diffracted wavelet passes through the light-transmissive area TA, and thus the inversely-diffracted wavelet may be eventually converted into a non-diffracted wavelet. Thus, the light having the non-diffracted wavelet proceeds toward the viewing area. Thus, the viewer may recognize an image of the background area having reduced wavelet diffraction.

As described above, according to the embodiment of the present disclosure, the wavelet diffraction phenomenon that may be caused by the light-transmissive area TA of the display device 1 may be reduced, thereby improving the visibility of the light-transmissive area TA.

The plurality of patterns 103 may include at least one of a distribution density increasing pattern section DIP in which a distribution density increases in one direction and a distribution density decreasing pattern section DDP in which a distribution density decreases in one direction.

Therefore, the light-emitting area pattern portion EAP may include at least one of the distribution density increasing pattern section DIP in which the distribution density increases in one direction and the distribution density decreasing pattern section DDP in which the distribution density decreases in one direction.

For example, referring to FIGS. 2 and 3, when a positive direction in an X-axis (e.g., +x direction) is defined as one direction, the distribution density increasing pattern sections DIP and the distribution density decreasing pattern sections DDP may be alternately arranged with each other.

In this case, when a negative direction in the X-axis (e.g., −x direction) is defined as one direction, the distribution density increasing pattern section DIP may be changed to the distribution density decreasing pattern section DDP, and the distribution density decreasing pattern section DDP may be changed to the distribution density increasing pattern section DIP. As shown, in FIGS. 2 and 3, a distance between two adjacent patterns 103 increases or decreases based on the direction for each section. For instance, in a distribution density decreasing pattern section DDP, the distance between two adjacent patterns 103 increases in the +x direction. On the other hand, in a distribution density increasing pattern section DIP, the distance between two adjacent patterns 103 increases in the −x direction. Or differently put, in a distribution density increasing pattern section DIP, the distance between two adjacent patterns 103 gradually decreases in the +x direction. The decrease in distance between two adjacent patterns 103 indicate that the distribution density increases.

Referring to FIG. 2, a distance between two immediately adjacent patterns 103 is denoted as distance D1. A distance between two immediately adjacent patterns 103 in the +x direction is denoted as distance D2, D3, and D4. As illustrated, the distance between two immediately adjacent patterns 103 varies depending on the direction within a certain section. For instance, the distance between two immediately adjacent patterns 103 becomes smaller as it moves towards the +x direction in the distribution density increasing pattern section DIP. On the other hand, the distance between two immediately adjacent patterns 103 becomes greater as it moves towards the +x direction in the distribution density decreasing pattern section DDP. In one embodiment, the distance D1, D2, D3, and D4 between adjacent patterns 103 may gradually decrease as it moves towards the +x direction in the distribution density increasing pattern section DIP. Similarly, in the distribution density decreasing pattern section DDP, the distance between adjacent patterns 103 may gradually increase as it moves towards the +x direction.

Accordingly, in an embodiment of the present disclosure, positions of the distribution density increasing pattern section DIP and the distribution density decreasing pattern section DDP may be exchanged from each other, based on the direction in which the distribution density increases or decreases.

In the distribution density increasing pattern section DIP and the distribution density decreasing pattern section DDP, the distribution density may be gradually increased or decreased as in a gradation manner.

For example, in the distribution density increasing pattern section DIP and the distribution density decreasing pattern section DDP, the distribution density may be changed in a continuous curve manner, rather than in a discontinuous stepped manner.

When the distribution density of the patterns 103 increases, the transmittance of a corresponding area thereto may decrease. When the distribution density of the patterns 103 decreases, the transmittance of a corresponding area thereto may increase.

Therefore, in the light-emitting area EA, transmittance increasing areas TIP in which transmittance increases in one direction and transmittance decreasing areas TDP in which transmittance decreases in one direction may be alternately arranged with each other.

For example, referring to FIG. 2 and FIG. 3, when the positive direction in the X-axis (e.g., +x direction) is defined as one direction, the transmittance decreasing areas TDP and the transmittance increasing areas TIP may be alternately arranged with each other.

In this case, when the negative direction of the X-axis (e.g., −x direction) is defined as one direction, the transmittance decreasing area TDP may be changed to the transmittance increasing area TIP, and the transmittance increasing area TIP may be changed to the transmittance decreasing area TDP.

As shown, in FIGS. 2 and 3, a distance between two adjacent patterns 103 increases or decreases based on the direction for each section. For instance, in a transmittance decreasing area TDP, the distance between two adjacent patterns 103 decreases in the +x direction. On the other hand, in a transmittance increasing area TIP, the distance between two adjacent patterns 103 decreases in the −x direction. Similarly, in a transmittance decreasing area TDP, the distance between two adjacent patterns 103 increases in the −x direction. On the other hand, in a transmittance increasing area TIP, the distance between two adjacent patterns 103 increases in the +x direction.

Accordingly, in an embodiment of the present disclosure, the positions of the transmittance decreasing area TDP and the transmittance increasing area TIP may be exchanged from each other, based on the direction in which the transmittance increases or decreases.

In the transmittance decreasing area TDP and the transmittance increasing area TIP, the transmittance may gradually increase or decrease as in a gradation manner.

For example, in the transmittance decreasing area TDP and the transmittance increasing area TIP, the transmittance may change not in a discontinuous stepped manner, but in a continuous curve shape.

Hereinafter, Present Examples of various patterns of the transmittance adjustment pattern member capable of further improving the visibility of the light-transmissive area will be described.

FIG. 6 shows a plan view and a cross-sectional view of each of Comparative Example free of transmittance adjustment pattern member and Present Examples including transmittance adjustment pattern member.

In Comparative Example, a pixel array including a plurality of sub-pixels is only present, while a separate transmittance adjustment pattern member IDL is not disposed below the pixel array.

In first Present Example, the transmittance adjustment pattern member IDL including the light-emitting area pattern portion EAP including the patterns arranged in a donut shape including a hollow is disposed under a pixel array including a plurality of sub-pixels.

As used herein, the hollow does not mean that any pattern is not present in the hollow area but means that the distribution density of the patterns in the hollow area is relatively lower, while the distribution density of the patterns in an area corresponding to the donut shape is relatively higher.

In second Present Example, the transmittance adjustment pattern member IDL is disposed under a pixel array including a plurality of sub-pixels and includes the light-emitting area pattern portion EAP in which four pattern groups are arranged in a matrix of two rows and two columns, and each pattern group includes the patterns arranged in a donut shape including a hollow.

In the plan view and the cross-sectional view of the transmittance adjustment pattern member IDL in FIG. 6, a darkness level of the black area is related to a level of transmittance. In this regard, as the darkness level is higher, the transmittance is lower, whereas as the darkness level is lower, the transmittance is higher.

(a) of FIG. 7 shows a target graph for transmittance control of the first Present Example and the second Present Example, and (b) in FIG. 7 shows a schematic diagram of transmittance control via arrangement of patterns.

As described above, the transmittance adjustment pattern member IDL of the first Present Example may include the light-emitting area pattern portion EAP including the patterns arranged in a donut shape including a hollow. The target graph for the transmittance control of the first Present Example may be identified in (a) of FIG. 7.

When the patterns 103 are arranged in a corresponding manner to the target graph for transmittance control of the first Present Example, the patterns 103 may be arranged to form the distribution density increasing pattern section in which the distribution density increases in one direction or a distribution density decreasing pattern section in which the distribution density decreases in one direction, and may be arranged in a circular shape.

Accordingly, the patterns 103 of the light-emitting area pattern portion EAP may be arranged substantially in a radial shape.

The pattern densities in the first Present Example of (b) of FIG. 7 may be arranged such that 'A area pattern density<B area pattern density<C area pattern density', and 'C area pattern density>D area pattern density>A area pattern density>E area pattern density>F area pattern density'.

For example, the central portion of the first Present Example may be formed in a round pattern having the D area pattern density, and having the C area pattern density that is higher than the D area pattern density toward the periphery.

In addition, from the round-shaped pattern of the C area pattern density, round-shaped patterns having the B area pattern density and the A area pattern density that are lower than the C area pattern density toward the periphery may be formed.

Therefore, in the light-emitting area pattern portion EAP, the distribution density increasing pattern section and the distribution density decreasing pattern section may be sequentially arranged in a direction from the center to the outer edge.

In the second Present Example, the transmittance adjustment pattern member IDL includes the light-emitting area pattern portion EAP in which four pattern groups are arranged in a matrix of two rows and two columns, and each pattern group includes the patterns arranged in a donut shape including a hollow. The target graph for the transmittance control of the second Present Example may be identified in (a) of FIG. 7.

When the patterns 103 are arranged in a corresponding manner to the target graph for transmittance control of the second Present Example, four pattern groups may be arranged in a matrix of two rows and two columns, and each pattern group may include the patterns arranged in a donut shape including a hollow.

Therefore, in the light-emitting area pattern portion EAP of the second Present Example, four pattern groups may be arranged in a matrix of two rows and two columns and around a center of the light-emitting area pattern portion EAP, wherein each pattern group may include the patterns arranged in a donut shape including a hollow.

In this regard, in each of the four pattern groups, the patterns 103 may be arranged to form the distribution density increasing pattern section in which the distribution density increases in one direction or a distribution density decreasing pattern section in which the distribution density decreases in one direction, and may be arranged in a circular shape.

Accordingly, in each of the four pattern groups arranged in the light-emitting area pattern portion EAP, the patterns 103 may be arranged substantially in a radial shape.

The pattern densities in the second Present Example of (b) of FIG. 7 may be arranged such that 'A area pattern density<B area pattern density<C area pattern density,' and 'C area pattern density>D area pattern density>A area pattern density>E area pattern density>F area pattern density.'

For example, the central portion of the second Present Example may be formed in a pattern having the D area pattern density, and having the C area pattern density that is higher than the D area pattern density toward the periphery.

In addition, from the pattern of the C area pattern density, the pattern of the D area pattern density lower than the C area pattern density may be re-formed toward the periphery. In addition, from the pattern having the D area pattern density to the periphery, a pattern having the C area pattern density having a higher density than the D area pattern density may be formed.

In addition, from the pattern of the C area pattern density to the periphery, patterns having the B area pattern density and the A area pattern density lower than the C area pattern density may be formed.

Therefore, in the light-emitting area pattern portion EAP, the distribution density increasing pattern sections and the distribution density decreasing pattern sections may be sequentially and alternately arranged in a direction from the center to the outer edge.

In the light-transmissive area pattern portion TAP of the transmittance adjustment pattern member IDL, the distribution density may decrease as the area extends from an outer edge E thereof toward a center F.

In the light-transmissive area pattern portion TAP, the patterns may be arranged such that 'E area pattern density>F area pattern density.'

For example, in the light-transmissive area pattern portion TAP, the patterns may be arranged in a line shape.

Thus, the center of the light-transmissive area pattern portion TAP in which the patterns may be arranged in a line shape may have a transmittance higher than that of the outer edge of the light-transmissive area pattern portion TAP.

Referring to FIG. 7, the transmittance graph measured along a line passing the center of each of the first Present Example and the second Present Example may be identified.

In the first Present Example, in the light-emitting area pattern portion EAP, the transmittance decreasing section and the transmittance increasing section may be sequentially arranged in a direction from the center to the outer edge. In the second Present Example, in the light-emitting area pattern portion EAP, the transmittance decreasing sections and the transmittance increasing sections may be sequentially and alternately arranged in a direction from the center to the outer edge.

In this case, it may be identified that the transmittance in the light-emitting area pattern portion EAP may change not in a step-like discontinuous manner, but in a continuous curve shape.

Further, in each of the first Present Example and the second Present Example, in the light-transmissive area pattern portion TAP, the transmittance increases as the area extends from one side outer edge to the center, and then the transmittance decreases as the area extends from the center to the other outer edge.

In this case, in the light-transmissive area pattern portion TAP, the transmittance may change not in a stepped discontinuous manner, but in a continuous curve manner, as in the light-emitting area pattern portion EAP.

Further, the transmittance in the light-transmissive area pattern portion TAP may have a Gaussian distribution curved shape, and may be the highest level at the center of the light-transmissive area pattern portion TAP.

FIG. 8 shows an embodiment of a pattern arrangement of the transmittance adjustment pattern member IDL in each of a light-emitting area EA and a light-transmissive area TA according to an embodiment of the present disclosure.

The embodiment shown in FIG. 8 is based on an example in which the light-emitting area EA includes the first sub-pixel SP1, the second sub-pixel SP2, the third sub-pixel SP3, and the fourth sub-pixel SP4. However, the present disclosure is not limited thereto. The light-emitting area EA according to another embodiment of the present disclosure may have the larger or smaller number of sub-pixels. Thus, an arrangement form of sub-pixels in the light-emitting area EA according to an embodiment of the present disclosure is not limited thereto.

Further, the embodiment shown in FIG. 8 is based on an example in which the first sub-pixel SP1, the second sub-pixel SP2, the third sub-pixel SP3, and the fourth sub-pixel SP4 render white W, red R, green G, and blue B colors, respectively. However, the present disclosure is not limited thereto. An arrangement order of sub-pixels rendering the different colors may be changed.

In FIG. 8, (a) is a schematic diagram illustrating transmittance control example via arrangement of patterns of third Present Example, and (b) is a schematic diagram illustrating transmittance control example via arrangement of patterns of fourth Present Example.

The patterns 103 in the light-emitting area pattern portion EAP according to the third Present Example may be arranged to form a distribution density increasing pattern section in which the distribution density increases in one direction or a distribution density decreasing pattern section in which the distribution density decreases in one direction and may be arranged in a circular manner.

Accordingly, the patterns 103 of the light-emitting area pattern portion EAP may be arranged substantially in a radial shape.

The pattern densities in the third Present Example of (a) in FIG. 8 may be arranged as follows along a center line IV-IV' and in a direction in which the first sub-pixel SP1, the second sub-pixel SP2, the third sub-pixel SP3, and the fourth sub-pixel SP4 are arranged side by side.

For example, in the light-emitting area pattern portion EAP, the pattern densities may be arranged such that B area pattern density, C area pattern density, D area pattern density, C area pattern density, B area pattern density, A area pattern density, and E area pattern density may be arranged in this order along the center line IV-IV' and in one direction.

Further, in the light-transmissive area pattern portion TAP, the pattern densities may be arranged such that E area pattern density, F area pattern density, and E area pattern density may be arranged in one direction.

In this case, the pattern densities may be arranged such that 'A area pattern density<B area pattern density<C area pattern density,' and 'C area pattern density>D area pattern density>A area pattern density>E area pattern density>F area pattern density.'

The pattern densities of the areas as described above may correspond to the plurality of sub-pixels included in the light-emitting area EAP as follows.

For example, the first sub-pixel SP1 may include the B area pattern density and the C area pattern density. The second sub-pixel SP2 may include the C area pattern density and the D area pattern density. The third sub-pixel SP3 may include the D area pattern density and the C area pattern density. The fourth sub-pixel SP4 may include the B area pattern density, the A area pattern density, and the E area pattern density.

In the fourth Present Example, the transmittance adjustment pattern member IDL includes the light-emitting area pattern portion EAP in which four pattern groups are arranged in a matrix of two rows and two columns, and each pattern group includes the patterns arranged in a donut shape including a hollow.

When the patterns 103 are arranged in a corresponding manner to the target graph for transmittance control of the fourth Present Example, four pattern groups may be arranged in a matrix of two rows and two columns, and each pattern group may include the patterns arranged in a donut shape including a hollow.

Therefore, in the light-emitting area pattern portion EAP of the fourth Present Example, four pattern groups may be arranged in a matrix of two rows and two columns and around a center of the light-emitting area pattern portion EAP, wherein each pattern group may include the patterns arranged in a donut shape including a hollow.

In this regard, in each of the four pattern groups, the patterns 103 may be arranged to form the distribution density increasing pattern section in which the distribution density increases in one direction or a distribution density decreasing pattern section in which the distribution density decreases in one direction, and may be arranged in a circular shape.

Accordingly, in each of the four pattern groups arranged in the light-emitting area pattern portion EAP, the patterns 103 may be arranged substantially in a radial shape.

The pattern densities in the fourth Present Example of (b) in FIG. 8 may be arranged as follows along a center line IV-IV' and in a direction in which the first sub-pixel SP1, the second sub-pixel SP2, the third sub-pixel SP3, and the fourth sub-pixel SP4 are arranged side by side.

For example, the pattern densities may be arranged in the light-emitting area pattern portion EAP such that B area pattern density, C area pattern density, D area pattern density, C area pattern density, B area pattern density, A area pattern density and E area pattern density may be arranged in this order and along the center line IV-IV' and in one direction.

Further, in the light-transmissive area pattern portion TAP, the pattern densities may be arranged such that E area pattern density, F area pattern density, and E area pattern density may be arranged in this order and along the center line IV-IV' and in one direction.

In this case, the pattern densities in the fourth Present Example of (b) of FIG. 8 may be arranged such that 'A area pattern density<B area pattern density<C area pattern density,' and 'C area pattern density>D area pattern density>A area pattern density>E area pattern density>F area pattern density.'

The pattern densities of the areas as described above may correspond to the plurality of sub-pixels included in the light-emitting area EAP as follows.

For example, the first sub-pixel SP1 may include the B area pattern density and the C area pattern density. The second sub-pixel SP2 may include the C area pattern density and the D area pattern density. The third sub-pixel SP3 may include the D area pattern density and the C area pattern density. The fourth sub-pixel SP4 may include the B area pattern density, the A area pattern density, and the E area pattern density.

In addition, in the light-emitting area pattern portion EAP, the pattern densities may be arranged such that B area pattern density, C area pattern density, D area pattern density, C area pattern density, D area pattern density, C area pattern density, D area pattern density, C area pattern density, B area pattern density, and A area pattern density may be arranged in this order along a diagonal line V-V' and in one direction.

The pattern densities of the areas as described above may correspond to the plurality of sub-pixels included in the light-emitting area EAP as follows.

For example, the first sub-pixel SP1 may include the B area pattern density, the C area pattern density, and the D area pattern density. The second sub-pixel SP2 may include the C area pattern density and the D area pattern density. The third sub-pixel SP3 may include the D area pattern density and the C area pattern density. The fourth sub-pixel SP4 may include the C area pattern density, the B area pattern density, and the A area pattern density.

FIG. 9 shows comparison between transmittance of Comparative Example free of transmittance adjustment pattern member and transmittance of each of Present Examples including transmittance adjustment pattern member.

It may be identified from the transmittance graph that no separate transmittance adjustment pattern member is formed in the Comparative Example, such that an area corresponding to the light-emitting area pattern portion EAP has 0% transmittance and an area corresponding to the light-transmissive area pattern portion TAP has 100% transmittance.

To the contrary, it may be identified from the transmittance graph that in each of the first Present Example and the second Present Example, the transmittance decrease sections and the transmittance increase sections are arranged alternately with each other as described above, the transmittance is changed in a curved continuous manner.

FIG. 10 shows comparison between transmittance of Comparative Example not including transmittance adjustment pattern member according to FIG. 6 and transmittance of each of Present Examples including the transmittance adjustment pattern member according to FIG. 6. FIG. 11 shows the diffraction phenomenon of each of Comparative Example and Present Examples.

(a) in FIG. 10 is a graph showing transmittance based on a 2D model, (b) in FIG. 10 is a graph showing transmittance based on a 1D model, and (c) in FIG. 10 is a graph showing transmittance based on a 3D model.

As shown in FIG. 10, in the first Present Example, the transmittance adjustment pattern member IDL includes the light-emitting area pattern portion EAP including the patterns arranged in a donut shape including a hollow. In the second Present Example, the transmittance adjustment pattern member IDL includes the light-emitting area pattern portion EAP in which four pattern groups are arranged in a matrix of two rows and two columns, and each pattern group includes the patterns arranged in a donut shape including a hollow.

Referring to FIG. 11, it may be identified that in Comparative Example, diffraction may not occur around the center, but an axis causing the diffraction may be formed around the center such that diffraction may be spread widely to an outer edge.

On the contrary, it may be identified that in each of the first Present Example and the second Present Example, only a first order peak concentrated on the center occurs around the center.

Therefore, it may be clearly identified that in the first Present Example in which the transmittance adjustment pattern member IDL includes the light-emitting area pattern portion EAP including the patterns arranged in a donut shape including a hollow or in the second Present Example in which the transmittance adjustment pattern member IDL includes the light-emitting area pattern portion EAP in which four pattern groups are arranged in a matrix of two rows and two columns, and each pattern group includes the patterns arranged in a donut shape including a hollow, the diffraction control may be more effectively achieved and thus the visibility of the light-transmissive area may be improved.

FIG. 12 and FIG. 13 show the diffraction results based on various arrangement shapes of patterns in the light-emitting area pattern portion.

(a) in FIG. 12 shows an arrangement shape of patterns in the light-emitting area pattern portion of each of first Experimental Example, second Experimental Example, and third Experimental Example, and (b) and (c) in FIG. 12 show two-dimensional and one-dimensional diffraction results, respectively.

In the first Experimental Example, in the light-emitting area pattern portion, the patterns are arranged in a triangular shape. In the second Experimental Example, in the light-emitting area pattern portion, the patterns are arranged in a rectangular shape. In the third Experimental Example, in the light-emitting area pattern portion, the patterns are arranged in a circular shape.

It may be identified that when, as in the first Experimental Example and the second Experimental Example, the patterns in the light-emitting area pattern portion are arranged in the triangular or rectangular manner instead of the circular manner, a plurality of axes causing diffraction may be generated according to the arrangement shape of the patterns.

On the contrary, it may be identified that when the patterns in the light-emitting area pattern portion are arranged in the circular manner as in the third Experimental Example, the diffraction may occur in a radial manner.

Accordingly, the patterns in the light-emitting area pattern portion are arranged in the circular manner as in the third Experimental Example, thereby suppressing the generation of an axis causing the diffraction and causing the diffraction to occur substantially in the radial manner. This may be advantageous in diffraction control.

(a) and (b) of FIG. 13 are respectively two-dimensional and one-dimensional diagrams of an arrangement shape of patterns in the light-emitting area pattern portion of each of the 4th Experimental Example, the 5th Experimental Example, the 6th Experimental Example, and the 7th Experimental Example. (c) and (d) in FIG. 13 show two-dimensional and one-dimensional diffraction results, respectively.

In the fourth Experimental Example, in the light-emitting area pattern portion, the patterns are arranged in a circular shape. In the fifth Experimental Example, in the light-emitting area pattern portion, the patterns are arranged in a hollow donut shape.

Referring to (b) of FIG. 13, it may be identified that in each of the 4th Experimental Example and the 5th Experimental Example, transmittance in an area in which the patterns are formed and transmittance of an area in which the patterns are not formed are discontinuous with each other.

Therefore, in each of the 4th Experimental Example and the 5th Experimental Example, the pattern density may be substantially constant across the area where the patterns are formed. In the 5th Experimental Example, in the hollow area of the donut shape, no pattern is formed.

Further, in the 6th Experimental Example, in the light-emitting area pattern portion, the patterns are arranged in a circular manner such that the density increasing section in which the distribution density gradually increases in one direction and the density decreasing section in which the distribution density gradually decreases in one direction are alternately arranged with each other. In the 7th Experimental Example, in the light-emitting area pattern portion, the patterns are arranged in a hollow donut shape such that the density increasing section in which the distribution density gradually increases in one direction and the density decreasing section in which the distribution density gradually decreases in one direction are alternately arranged with each other.

Referring to (b) of FIG. 13, it may be identified that in each of the 6th Experimental Example and the 7th Experimental Example, transmittance in an area in which the patterns are formed and transmittance of an area in which the patterns are not formed are continuous with each other.

Therefore, in the 6th Experimental Example, in the light-emitting area pattern portion, the patterns are arranged in a circular manner such that the pattern density decreases as the portion extends from the center to the outer edge thereof. In the 7th Experimental Example, the patterns are arranged in a hollow donut shape such that the pattern density increases and then decreases as the portion extends from the center to the outer edge thereof.

Unlike the 5th Experimental Example, in the 7th Experimental Example, in the center hollow area of the donut shape, the patterns are formed so as to have a relatively lower pattern density than that in the donut area.

It may be identified that when, as in the 4th Experimental Example, in the light-emitting area pattern portion, the patterns are arranged in the circular manner, diffraction occurs radially in an area closer to the center, while a second-order diffraction pattern having directionality occurs as the area extends away from the center.

In comparison to the 4th Experimental Example, in the 6th Experimental Example, in the light-emitting area pattern portion, the patterns are arranged in a circular manner such that the density increasing section in which the distribution density gradually increases in one direction and the density decreasing section in which the distribution density gradually decreases in one direction are alternately arranged with each other. In this case, it may be identified that diffraction occurs radially in an area closer to the center, while a second-order diffraction pattern having directionality occurring as the area extends away from the center may be reduced, compared to the fourth Experimental Example.

Further, it may be identified that in the fifth Experimental Example in which, in the light-emitting area pattern portion, the patterns are arranged in a hollow donut shape, diffraction may be controlled more effectively compared to the 4th Experimental Example in which, in the light-emitting area pattern portion, the patterns are arranged in a circular manner.

In comparison to the 5th Experimental Example, in the 7th Experimental Example, in the light-emitting area pattern portion, the patterns are arranged in a hollow donut shape such that the density increasing section in which the distribution density gradually increases in one direction and the density decreasing section in which the distribution density gradually decreases in one direction are alternately arranged with each other. In this case, it may be identified that diffraction occurs radially in an area closer to the center, while a second-order diffraction pattern having directionality occurring as the area extends away from the center may be removed.

Therefore, it may be identified that in the 7th Experimental Example, the diffraction may be very effectively controlled by adjusting the pattern density, and thus the visibility of the light-transmissive area may be greatly improved.

Accordingly, according to an embodiment of the present disclosure, the plurality of patterns are arranged in at least one of a distribution density increasing manner in which a distribution density increases in one direction and a distribution density decreasing manner in which a distribution density decreases in one direction. Thus, the transmittance adjustment pattern member may be capable of controlling transmittance such that the wavelet diffraction may be reduced uniformly across a total area from a center to an outer edge of the light-emitting area.

According to an embodiment of the present disclosure, the patterns arranged in the distribution density increasing pattern section and the distribution density decreasing pattern section are arranged in a circular manner, thereby suppressing generation of an axis causing the diffraction and causing the diffraction to occur substantially in the radial manner. This may be advantageous in diffraction control.

According to an embodiment of the present disclosure, in the light-emitting area pattern portion, the patterns are arranged in a donut shape having a hollow. Thus, the diffraction control may be more effectively achieved, and the visibility of the light-transmissive area may be further improved.

A display device according to an embodiment of the present disclosure may be described as follows.

A first aspect of the present disclosure provides a display device comprising: a substrate including a light-emitting area and a light-transmissive area; at least one light-emitting element disposed on a top face of the substrate and in the light-emitting area; and transmittance adjustment pattern member disposed under the light-emitting element and in the light-emitting area and the light-transmissive area, wherein the transmittance adjustment pattern member includes a plurality of patterns arranged in the light-emitting area and the light-transmissive area, wherein a distribution density of the patterns in the light-emitting area is higher than a distribution density of the patterns in the light-transmissive area.

In one implementation of the first aspect, the transmittance adjustment pattern member further includes a base layer, wherein the plurality of patterns are disposed on one face of the base layer.

In one implementation of the first aspect, the transmittance adjustment pattern member is disposed on a bottom face of the substrate.

In one implementation of the first aspect, the transmittance adjustment pattern member is disposed between the substrate and the light-emitting element.

In one implementation of the first aspect, the light-emitting area includes a plurality of sub-pixels.

In one implementation of the first aspect, the plurality of patterns are arranged in at least one of a distribution density increasing manner in which a distribution density increases in one direction and a distribution density decreasing manner in which a distribution density decreases in one direction.

In one implementation of the first aspect, in the light-emitting area, the plurality of patterns are arranged such that transmittance decreasing areas in which transmittance decreases in one direction and transmittance increasing areas in which transmittance increases in one direction are alternately arranged with each other.

In one implementation of the first aspect, each of the patterns includes black resin.

A second aspect of the present disclosure provides a display device comprising: a substrate including a light-emitting area and a light-transmissive area; and transmittance adjustment pattern member disposed on one face of the substrate, wherein the transmittance adjustment pattern member includes a light-emitting area pattern portion corresponding to the light-emitting area and a light-transmissive area pattern portion corresponding to the light-transmissive area, wherein the transmittance adjustment pattern member includes patterns, wherein a distribution density of the patterns arranged in the light-emitting area pattern portion is higher than a distribution density of the patterns arranged in the light-transmissive area pattern portion.

In one implementation of the second aspect, the light-emitting area pattern portion includes at least one of a distribution density increasing pattern section in which the distribution density increases in one direction and a distribution density decreasing pattern section in which the distribution density decreases in one direction.

In one implementation of the second aspect, the patterns arranged in the distribution density increasing pattern section and the distribution density decreasing pattern section are arranged in a circular manner.

In one implementation of the second aspect, the light-emitting area pattern portion includes the distribution density increasing pattern section and the distribution density decreasing pattern section sequentially arranged in this order in a direction from a center of the light-emitting area pattern portion to an outer edge thereof.

In one implementation of the second aspect, the light-emitting area pattern portion includes the distribution density increasing pattern sections and the distribution density decreasing pattern sections sequentially and alternately arranged in this order in a direction from a center of the light-emitting area pattern portion to an outer edge thereof.

In one implementation of the second aspect, the light-emitting area pattern portion includes the patterns arranged in a donut shape having a hollow.

In one implementation of the second aspect, in the light-emitting area pattern portion, four pattern groups are arranged in a matrix of two rows and two columns, wherein each pattern group includes the patterns arranged in a donut shape having a hollow.

In one implementation of the second aspect, the distribution density of the patterns arranged in the light-transmissive area pattern portion decreases as the light-transmissive area pattern portion extends from an outer edge thereof toward a center thereof.

In one implementation of the second aspect, transmittance in the light-transmissive area is distributed in a Gaussian curve shape.

In one implementation of the second aspect, the light-transmissive area pattern portion includes the patterns arranged in a linear shape.

In one implementation of the second aspect, each of the light-emitting area pattern portion and the light-transmissive area pattern portion includes the plurality of patterns arranged therein.

In one implementation of the second aspect, the distribution density is defined as a percentage of an area occupied by the patterns per unit area.

In one implementation of the second aspect, the light-emitting area includes a first sub-pixel, a second sub-pixel, a third sub-pixel and a fourth sub-pixel, wherein in the light-emitting area pattern portion, the patterns are arranged such that B area pattern density, C area pattern density, D area pattern density, C area pattern density, B area pattern density, A area pattern density, and E area pattern density are sequentially arranged in this order in one direction and along a horizontal line passing through a center of the light-emitting area pattern portion, wherein in the light-transmissive area pattern portion, the patterns are arranged such that the E area pattern density, F area pattern density, and the E area pattern density are sequentially arranged in this order in one direction and along the horizontal line, wherein in one direction and along the horizontal line, the first sub-pixel includes the B area pattern density and the C area pattern density, the second sub-pixel includes the C area pattern density and the D area pattern density, the third sub-pixel includes the D area pattern density and the C area pattern density, and the fourth sub-pixel includes the B area pattern density, the A area pattern density, and the E area pattern density, wherein the amounts of the pattern density are such that the A area pattern density<the B area pattern density<the C area pattern density, and the C area pattern density>the D area pattern density>the A area pattern density>the E area pattern density>the F area pattern density.

In one implementation of the second aspect, the light-emitting area pattern portion includes the patterns arranged such that the B area pattern density, the C area pattern density, the D area pattern density, the C area pattern density, the D area pattern density, the C area pattern density, the D area pattern density, the C area pattern density, the B area pattern density, and the A area pattern density are sequentially arranged in this order in one direction and along a diagonal line passing through a center of the light-emitting area pattern portion, wherein in one direction and along the diagonal line, the first sub-pixel includes the B area pattern density, the C area pattern density, and the D area pattern density, the second sub-pixel includes the C area pattern density and the D area pattern density, the third sub-pixel includes the D area pattern density and the C area pattern density, and the fourth sub-pixel includes the C area pattern density, the B area pattern density, and the A area pattern density.

In one implementation of the second aspect, the first sub-pixel renders a white color W, the second sub-pixel renders a red color R, the third sub-pixel renders a green color G, and the fourth sub-pixel renders a blue color B.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. All technical ideas within the scope of the present disclosure should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate including a light-emitting area and a light-transmissive area, the light-emitting area including a plurality of sub-pixels;
at least one light-emitting element disposed on a top face of the substrate and in the light-emitting area; and
a transmittance adjustment pattern member disposed under the light-emitting element and in the light-emitting area and the light-transmissive area, wherein the transmittance adjustment pattern member includes a plurality of patterns arranged in the light-emitting area and the light-transmissive area,
wherein a distribution density of the patterns in the light-emitting area is higher than a distribution density of the patterns in the light-transmissive area.

2. The display device of claim 1, wherein the transmittance adjustment pattern member further include a base layer, wherein the plurality of patterns are disposed on one face of the base layer.

3. The display device of claim 2, wherein the transmittance adjustment pattern member is disposed on a bottom face of the substrate.

4. The display device of claim 1, wherein the transmittance adjustment pattern member is disposed between the substrate and the light-emitting element.

5. The display device of claim 1, wherein the plurality of patterns are arranged in at least one of a distribution density increasing manner in which a distribution density increases in one direction of the display device and a distribution density decreasing manner in which a distribution density decreases in one direction of the display device.

6. The display device of claim 1, wherein in the light-emitting area, the plurality of patterns are arranged such that transmittance decreasing areas in which transmittance decreases in one direction and transmittance increasing areas in which transmittance increases in one direction are alternately arranged with each other.

7. The display device of claim 1, wherein each of the plurality of patterns includes black resin.

8. A display device comprising:
a substrate including a light-emitting area and a light-transmissive area; and
transmittance adjustment pattern member disposed on one face of the substrate, wherein the transmittance adjustment pattern member includes a light-emitting area pattern portion corresponding to the light-emitting area and a light-transmissive area pattern portion corresponding to the light-transmissive area, wherein the transmittance adjustment pattern member includes patterns,
wherein a distribution density of the patterns arranged in the light-emitting area pattern portion is higher than a distribution density of the patterns arranged in the light-transmissive area pattern portion.

9. The display device of claim 8, wherein the light-emitting area pattern portion includes at least one of a distribution density increasing pattern section in which the distribution density increases in one direction and a distribution density decreasing pattern section in which the distribution density decreases in one direction.

10. The display device of claim 9, wherein the distribution density increasing pattern section and the distribution density decreasing pattern section are arranged in a circular manner.

11. The display device of claim 9, wherein the light-emitting area pattern portion includes the distribution density increasing pattern section and the distribution density decreasing pattern section sequentially arranged in this order in a direction from a center of the light-emitting area pattern portion to an outer edge thereof.

12. The display device of claim 9, wherein the light-emitting area pattern portion includes the distribution density increasing pattern sections and the distribution density decreasing pattern sections sequentially and alternately arranged in this order in a direction from a center of the light-emitting area pattern portion to an outer edge thereof.

13. The display device of claim 8, wherein the light-emitting area pattern portion includes the patterns arranged in a donut shape having a hollow.

14. The display device of claim 8, wherein in the light-emitting area pattern portion, four pattern groups are arranged in a matrix of two rows and two columns, wherein each pattern group includes the patterns arranged in a donut shape having a hollow.

15. The display device of claim 8, wherein the distribution density of the patterns arranged in the light-transmissive area pattern portion decreases as the light-transmissive area pattern portion extends from an outer edge thereof toward a center thereof.

16. The display device of claim 8, wherein transmittance in the light-transmissive area is distributed in a Gaussian curve shape.

17. The display device of claim 8, wherein the light-transmissive area pattern portion includes the patterns arranged in a linear shape.

18. The display device of claim 8, wherein each of the light-emitting area pattern portion and the light-transmissive area pattern portion includes a plurality of the patterns arranged therein.

19. The display device of claim 8, wherein the distribution density is defined as a percentage of an area occupied by the patterns per unit area.

20. The display device of claim 8, wherein the light-emitting area includes a first sub-pixel, a second sub-pixel, a third sub-pixel and a fourth sub-pixel,
wherein the light-emitting area pattern portion includes the patterns arranged such that B area pattern density, C area pattern density, D area pattern density, C area pattern density, B area pattern density, A area pattern density, and E area pattern density are sequentially arranged in this order in one direction and along a horizontal line passing through a center of the light-emitting area pattern portion,
wherein the light-transmissive area pattern portion includes the patterns arranged such that the E area pattern density, F area pattern density, and the E area pattern density are sequentially arranged in this order in one direction and along the horizontal line,
wherein in one direction and along the horizontal line, the first sub-pixel includes the B area pattern density and the C area pattern density, the second sub-pixel includes the C area pattern density and the D area pattern density, the third sub-pixel includes the D area pattern density and the C area pattern density, and the fourth sub-pixel includes the B area pattern density, the A area pattern density, and the E area pattern density,
wherein the amounts of the pattern density are such that the A area pattern density<the B area pattern density<the C area pattern density, and the C area pattern density>the D area pattern density>the A area pattern density>the E area pattern density>the F area pattern density.

21. The display device of claim 20, wherein the light-emitting area pattern portion includes the patterns arranged such that the B area pattern density, the C area pattern density, the D area pattern density, the C area pattern density, the D area pattern density, the C area pattern density, the D area pattern density, the C area pattern density, the B area pattern density, and the A area pattern density are sequentially arranged in this order in one direction and along a diagonal line passing through a center of the light-emitting area pattern portion,
wherein in one direction and along the diagonal line, the first sub-pixel includes the B area pattern density, the C area pattern density, and the D area pattern density, the second sub-pixel includes the C area pattern density and the D area pattern density, the third sub-pixel includes the D area pattern density and the C area pattern density, and the fourth sub-pixel includes the C area pattern density, the B area pattern density, and the A area pattern density.

22. The display device of claim 20, wherein the first sub-pixel renders a white color, the second sub-pixel renders a red color, the third sub-pixel renders a green color, and the fourth sub-pixel renders a blue color.

23. A display device comprising:
a light-emitting area including a plurality of sub-pixels on a first surface of a substrate, the plurality of sub-pixels including a first sub-pixel, a second sub-pixel, and a third sub-pixel arranged in a first direction of the display device;
a light-transmissive area adjacent to the light-emitting area; and
transmittance adjustment pattern member adjacent to the substrate, the transmittance adjustment pattern member including a plurality of patterns having a first distance between two adjacent patterns of the plurality and a second distance between two different adjacent patterns that is greater than the first distance,
wherein the light-emitting area includes a first section having a distance between two adjacent patterns gradually increasing in the first direction, and a second section having distance between two adjacent patterns gradually decreasing in the first direction.

24. The display device of claim 23, wherein the first section and the second section are alternately arranged in the light-emitting area.

25. The display device of claim 23, wherein the plurality of patterns are on the first surface of the substrate, the transmittance adjustment pattern member includes a base layer on the plurality of patterns.

26. The display device of claim 23, wherein the plurality of patterns are on a second surface of the substrate, the transmittance adjustment pattern member includes a base layer on a second surface opposite of the first surface of the substrate, the base layer being between the substrate and the plurality of patterns.

* * * * *